United States Patent
Fosberry et al.

(10) Patent No.: US 6,214,640 B1
(45) Date of Patent: Apr. 10, 2001

(54) METHOD OF MANUFACTURING A PLURALITY OF SEMICONDUCTOR PACKAGES

(75) Inventors: Jennifer Fosberry, Santa Clara; Masud Beroz, Livermore; Mihalis Michael, Antioch; Philip Osborn, Mountain View, all of CA (US)

(73) Assignee: Tessera, Inc., San Jose, CA (US)

(*) Notice: Subject to any disclaimer, the term of this patent is extended or adjusted under 35 U.S.C. 154(b) by 0 days.

(21) Appl. No.: 09/366,152

(22) Filed: Aug. 3, 1999

Related U.S. Application Data
(60) Provisional application No. 60/119,450, filed on Feb. 10, 1999.

(51) Int. Cl.[7] .................. H01L 21/44; H01L 21/48; H01L 21/50
(52) U.S. Cl. .................. 438/106; 438/126; 438/127
(58) Field of Search .................. 438/106, 126, 438/127

(56) References Cited

U.S. PATENT DOCUMENTS

| | | |
|---|---|---|
| 3,390,308 | 6/1968 | Marley .................. 317/100 |
| 3,413,713 | 12/1968 | Helda et al. . |
| 3,614,832 | 10/1971 | Chance et al. . |
| 3,811,183 | 5/1974 | Celling . |
| 3,868,724 | 2/1975 | Perrino . |
| 3,906,144 | 9/1975 | Wiley . |
| 4,012,766 | 3/1977 | Phillips et al. . |
| 4,017,495 | 4/1977 | Jaffe et al. . |
| 4,143,456 | 3/1979 | Inoue . |
| 4,163,072 | 7/1979 | Soos . |
| 4,300,153 | 11/1981 | Hayakawa et al. . |
| 4,312,116 | 1/1982 | Moser et al. .................. 29/588 |
| 4,374,080 | 2/1983 | Schroeder . |
| 4,381,602 | 5/1983 | McIver . |
| 4,536,469 | 8/1985 | Adlerstein .................. 430/314 |

(List continued on next page.)

FOREIGN PATENT DOCUMENTS

| | | |
|---|---|---|
| 1-278755 | 11/1989 | (JP) . |
| 60-77446 | 11/1989 | (JP) . |
| WO-89/10005 | 10/1989 | (WO) . |

OTHER PUBLICATIONS

Bascom et al., "Air Entrapment in the Use of Structural Adhesive Films," J. Adhesion, 1972, vol. 4, pp. 193–209, © 1972 Gordon and Breach Science Publishers Ltd.

Cam/Alot–Fluids Dispensing Systems Diversified Applications, Jul. 26, 1999; http://www.camalot.com/applications.html; pp. 1–11.

Cam/Alot–Fluids Dispensing Systems Diversified Applications, Jul. 26, 1999; http://www.camalot.com/glossary.html; pp. 1–3.

*Primary Examiner*—John F. Niebling
*Assistant Examiner*—Josetta Jones
(74) *Attorney, Agent, or Firm*—Lerner, David, Littenberg, Krumholz & Mentlik, LLP

(57) ABSTRACT

A method of manufacturing a plurality of semiconductor chips packages and the resulting chip package assemblies. The method includes providing a circuitized substrate having terminals and leads. A spacer layer is deposited or attached to the substrate and each chip is then attached to the spacer layer. Typically, the spacer layer is comprised of a compliant or resilient material. The terminals and leads are interconnected using leads, at least some of which are fan-out leads. A ring-like pattern of a curable composition is disposed around each chip and cured to form a support structure. The assembly is encapsulated by dispensing a composition which is curable to an encapsulant into the gaps between the support structures and the chips. The encapsulant material is then cured thereby defining a composite of chip assemblies which may be singulated into individual chip packages.

26 Claims, 33 Drawing Sheets

U.S. PATENT DOCUMENTS

| | | |
|---|---|---|
| 4,566,184 | 1/1986 | Higgins et al. . |
| 4,616,412 | 10/1986 | Schroeder ............................... 29/827 |
| 4,658,332 | 4/1987 | Baker et al. ........................... 361/398 |
| 4,701,999 | 10/1987 | Palmer ................................... 437/211 |
| 4,707,724 | 11/1987 | Suzuki et al. . |
| 4,710,798 | * 12/1987 | Marcantonio . |
| 4,766,670 | 8/1988 | Gazdik et al. ......................... 29/830 |
| 4,829,666 | 5/1989 | Haghiri-Tehrani et al. . |
| 4,847,146 | 7/1989 | Yeh et al. .............................. 428/332 |
| 4,857,483 | 8/1989 | Steffen et al. . |
| 4,900,501 | 2/1990 | Saeki et al. . |
| 4,913,930 | 4/1990 | Getson ................................... 427/58 |
| 4,915,607 | 4/1990 | Medders et al. . |
| 4,918,811 | 4/1990 | Eichelberger et al. ................ 29/840 |
| 4,920,074 | 4/1990 | Shimizu et al. . |
| 4,953,173 | 8/1990 | Fujitsu . |
| 4,955,132 | 9/1990 | Ozawa . |
| 4,999,319 | 3/1991 | Hamano et al. ...................... 437/209 |
| 5,037,779 | 8/1991 | Whalley et al. . |
| 5,052,907 | 10/1991 | Matumoto et al. . |
| 5,055,913 | 10/1991 | Haghiri-Tehrani . |
| 5,075,760 | 12/1991 | Nakashima et al. . |
| 5,120,678 | 6/1992 | Moore et al. . |
| 5,130,781 | 7/1992 | Kovac et al. . |
| 5,148,265 | 9/1992 | Khandros et al. .................... 357/80 |
| 5,148,266 | 9/1992 | Khandros et al. .................... 357/80 |
| 5,203,076 | 4/1993 | Banerji et al. . |
| 5,249,101 | 9/1993 | Frey et al. . |
| 5,252,784 | 10/1993 | Asai et al. . |
| 5,258,330 | 11/1993 | Khandros et al. . |
| 5,289,346 | 2/1994 | Carey et al. ......................... 361/777 |
| 5,302,101 | 4/1994 | Nishimura . |
| 5,304,252 | 4/1994 | Condra et al. ....................... 134/2 |
| 5,304,512 | 4/1994 | Arai et al. . |
| 5,336,931 | 8/1994 | Juskey et al. . |
| 5,355,283 | 10/1994 | Marrs et al. . |
| 5,371,044 | 12/1994 | Yoshida et al. . |
| 5,385,869 | 1/1995 | Liu et al. . |
| 5,394,009 | 2/1995 | Loo . |
| 5,409,362 | 4/1995 | Neu . |
| 5,409,865 | 4/1995 | Karnezos . |
| 5,409,866 | 4/1995 | Sato et al. . |
| 5,477,611 | 12/1995 | Sweis et al. . |
| 5,483,106 | 1/1996 | Echigo et al. . |
| 5,489,749 | 2/1996 | DiStefano et al. . |
| 5,518,964 | 5/1996 | DiStefano et al. . |
| 5,536,909 | 7/1996 | DiStefano et al. . |
| 5,563,445 | 10/1996 | Iijima et al. . |
| 5,659,952 | 8/1997 | Kovac et al. . |
| 5,706,174 | 1/1998 | DiStefano et al. . |

* cited by examiner

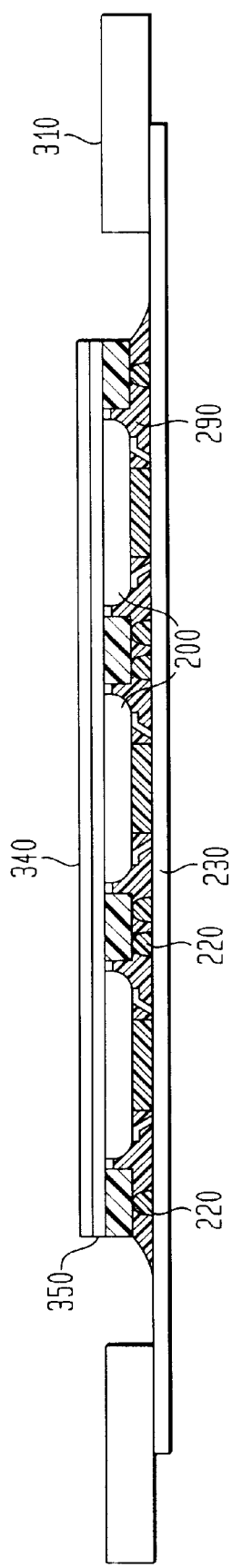
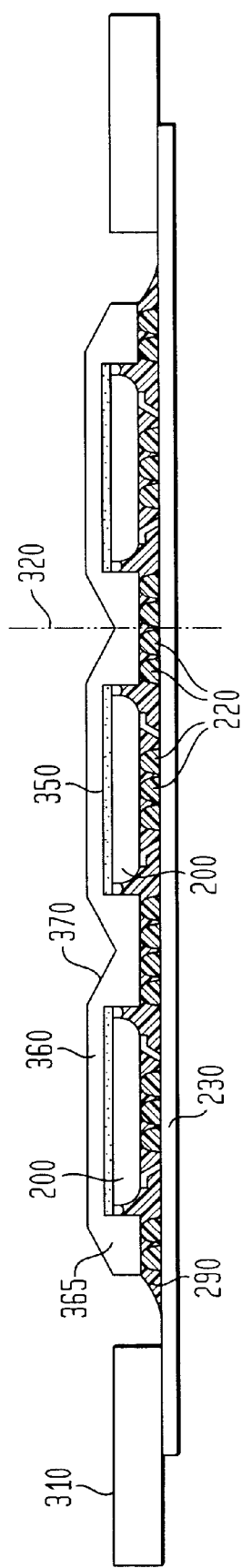
FIG. 15A
FIG. 15B

METHOD OF MANUFACTURING A PLURALITY OF SEMICONDUCTOR PACKAGES

CROSS REFERENCE TO RELATED APPLICATIONS

This application claims benefit of U.S. Provisional Patent Application Ser. No. 60/119,450 filed on Feb. 10, 1999, the disclosure of which is incorporated herein by reference. This application is related to commonly assigned U.S. patent application Ser. No. 09/067,310 filed on Apr. 28, 1998, which is a continuation-in-part of commonly assigned U.S. patent application Ser. No. 08/726,697 filed Oct. 7, 1996 (now U.S. Pat. No. 5,776,976), which is a continuation-in-part of commonly assigned U.S. patent application Ser. No 08/246,113 filed May 19, 1994 (now U.S. Pat. No. 5,663,106) and commonly assigned U.S. patent application Ser. No. 08/610,610 filed Mar. 7, 1996, (now U.S. Pat. No. 5,834,339), the disclosures of which are hereby incorporated herein by reference.

FIELD OF THE INVENTION

The present invention relates generally to a method of packaging a semiconductor chip or an array of such semiconductor chips.

BACKGROUND OF THE INVENTION

In the constriction of semiconductor chip package assemblies, it has been found desirable to interpose encapsulating material between and/or around elements of the semiconductor packages in an effort to reduce and/or redistribute the strain and stress on the connections between the semiconductor chip and a supporting circuitized substrate during operation of the chip, and to seal the elements against corrosion, as well as to insure intimate contact between the encapsulant, the semiconductor die and the other elements of the chip package.

It is often desirable to package a semiconductor chip assembly such that it can be handled with less fear of damage to the assembly so that a heat sink can be married with the semiconductor chip. However, if a semiconductor chip assembly is to be so packaged, the utmost care must be taken during the packaging process to avoid affecting the integrity of the terminals on the chip carrier. In particular, it is important to avoid contaminating the terminals on the chip carrier with the encapsulant.

Certain designs have reduced solder connection fatigue by redistributing the thermal cycling stress into a portion of the chip package itself. An example of such a design is shown in U.S. Pat. Nos. 5,148,265 and 5,148,266, the disclosures of which are incorporated herein by reference. One disclosed embodiment of these patents shows the use of a chip carrier in combination with a compliant layer to reduce the coefficient of thermal expansion ("CTE") mismatch problems. Typically, the compliant layer includes an elastomeric layer which, in the finished package, is disposed between the chip carrier and the face surface of the chip. The compliant layer provides resiliency to the individual terminals, allowing each terminal to move in relation to its electrically connected chip contact to accommodate CTE mismatch as necessary during testing, final assembly and thermal cycling of the device.

In some arrangements used heretofore, the compliant layer is formed by stenciling a thermoset resin onto the chip carrier and then curing the resin. Next, additional resin is applied to the exposed surface of the cured layer, this additional resin is partially cured, and the resulting tacky adhesive surface was used to bond the elastomeric layer to the chip and chip carrier. Once attached, the entire structure is heated and fully cured. The leads are then bonded to respective chip contacts. An encapsulant material is then disposed under and around the leads from the terminal side of the assembly. This process amounts to very carefully depositing a controlled amount of encapsulant on the periphery of the contact surface of the chip from the terminal side of the assembly, building layer upon layer of encapsulant until the leads are fully encapsulated. In such a process, the encapsulant is held in place by the surface tension of the encapsulant material between the dielectric layer and the contact bearing surface of the chip. Using such a method, the encapsulant material may creep on to the exposed surface of the dielectric layer potentially contaminating the terminals and also overcoming the surface tension of the encapsulant further causing the encapsulant to get onto other surfaces of the assembly or onto adjacent chip assemblies.

Another issue associated with some arrangements used heretofore is the use of a prefabricated support structure or ring gird. A prefabricated support structure may be disposed around the chip, generally before the encapsulation step, in order to planarize and/or rigidize the package, especially if the package has only "fan-out leads" or a combination of "fan-in leads" and "fan-out leads". By the term "fan-in leads" we mean that one end of the lead is connected to a portion of the chip carrier which is disposed directly beneath the chip. By the term "fan-out leads" we mean that one end of the lead is connected to a portion of the chip carrier which is not disposed directly under the chip. Whether the leads fan-in or fan-out, A semiconductor chip package will typically include means for interconnecting the leads to connection points on an external circuit, such as, for example, an array of solder balls. When such packages include fan-out leads, one or more rows of such solder balls are typically disposed outside the periphery of the semiconductor chip, and a support structure should be used to support such solder balls.

The support rings and ring grids used heretofore are typically manufactured in molding, stamping or etching processes. If the support structure or ring grid is prefabricated, such prefabricated component must be designed and manufactured specifically to accommodate the size, shape and arrangement of chips to be packaged. A different support structure may be needed for each type of chip to be packaged and, if a plurality of chips are to be packaged simultaneously using a ring grid, a new ring grid design may be needed each time the arrangement of chips is changed or modified.

Accordingly, new methods of encapsulating semiconductor chip assemblies without using prefabricated support structure or ring grids are desirable.

SUMMARY OF THE INVENTION

The present invention provides a method of packaging a semiconductor chip using a support structure or ring grid made in situ.

The method according to the present invention includes a method of packaging a plurality of semiconductor chips using dispensed support structures. First a sheet-like substrate having a first surface and a plurality of terminals disposed on the first surface is provided. A plurality of chips, each having a face surface with a plurality of contacts disposed thereon, is juxtaposed with the first surface of the substrate. In preferred embodiments, a compliant spacer layer is disposed between the substrate and the chips. The terminals are then electrically connected to contacts on the chips using leads, preferably such that at least some of the leads associated with each chip are fan-out leads. The leads are preferably flexible. A first composition is dispensed onto the substrate in a ring-like pattern around each chip, such that a gap is formed between each ring-like pattern and each chip. The ring-like patterns are cured to form support structures. The ring-like patterns may be positioned such that upon cure, the resulting support structures are interconnected and form a ring grid. A second composition is dispensed into the gaps to encapsulate the leads and at least one surface of each chip, thereby forming an interconnected plurality of packaged semiconductor chips. In preferred methods, the interconnected chips are then diced or singulated to form a plurality of individual semiconductor chips. The support structures may be conductive (electrically or thermally) or insulative. The support structures may have continuous, uniform sidewalls or may have segmented and/ or non-continuous sidewalls. In preferred embodiments, such segmented or non-continuous sidewalls are adapted to facilitate the flow of second composition to encapsulate the chips. Introduction and further may be segmented to facilitate introduction of the second composition into the gaps and/or to allow a plurality of chips to be encapsulated using just one or a few dispensers. The support structures are preferably rigid. In preferred embodiments, the support structure is rigid. The foregoing and other objects and advantages of the present invention will be better understood from the following Detailed Description of the Preferred Embodiments, taken together with the attached figures.

BRIEF DESCRIPTION OF THE DRAWINGS

FIG. 15A shows a cross-sectional side view of another semiconductor chip assembly, according to the present invention.

FIG. 15B shows a cross-sectional side view of another semiconductor chip assembly, according to the present invention.

FIGS. 22A–21C show progressive steps in a method according to another embodiment of the present invention of packaging a semiconductor chip using a ring grid made in situ.

DETAILED DESCRIPTION OF A PREFERRED EMBODIMENT

Figure 1:
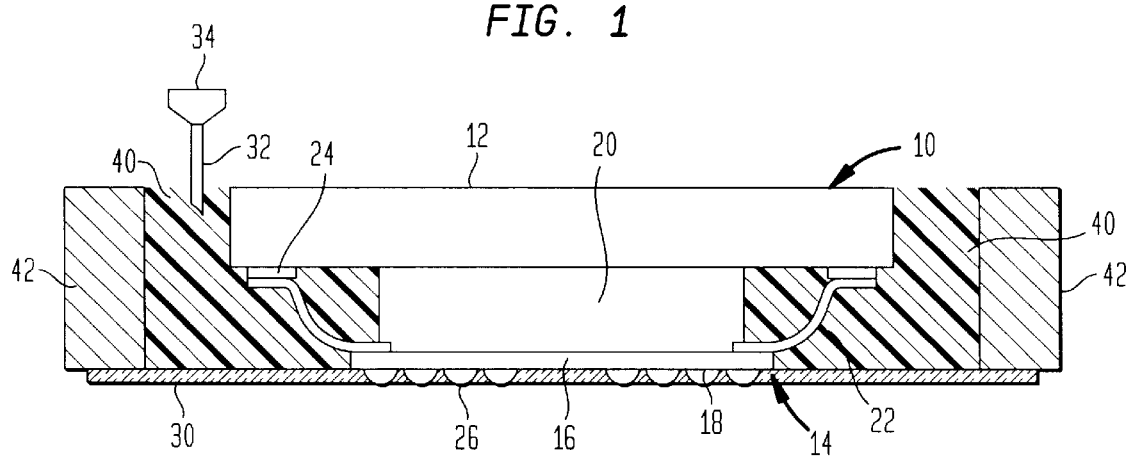
FIG. 1 is a side cross-sectional view, illustrating a semiconductor chip package assembly being encapsulated in an inverted position within a frame, according to the present invention.

Referring to FIG. 1, a semiconductor chip package assembly, generally designated as 10, includes a semiconductor chip 12 and a chip carrier 14. The chip carrier 14 is made up of a dielectric layer 16 (which may be flexible or rigid and is preferably made from a thin sheet of material such as polyimide) and a spacer layer 20 (typically compliant or elastomeric, referred to herein as a "compliant layer") disposed between the dielectric layer 16 and the semiconductor chip 12. The semiconductor chip 12 and the chip carrier 14 are electrically connected through a plurality of leads 22 which are connected to the chip 12 through chip contacts 24. The leads 22 are further electrically connected to terminals 26 on the first surface 18 of the chip carrier, 14. The terminals 26 connect the semiconductor chip assembly 10 to a printed wiring board ("PWB") or other substrate (not shown), thus the terminals 26 should remain uncontaminated throughout testing and final assembly so as to ensure a good electrical connection with the PWB.

FIG. 1 further shows the semiconductor chip package assembly 10 positioned within a ring, frame or panel 42 (generically referred to herein as a "frame"). Typically, frame 42 is comprised of a substantially planar sheet of material having an aperture within which the semiconductor chip package assembly 10 is placed such that there is a gap between each edge of the chip assembly and each respective side wall of the frame 42, as shown.

Figure 2:
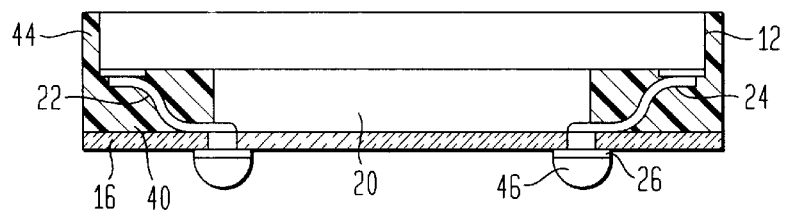
FIG. 2 is a side cross-sectional view of a singulated device having bumpers around the periphery of the chip package assembly, according to the present invention.
Figure 4A:
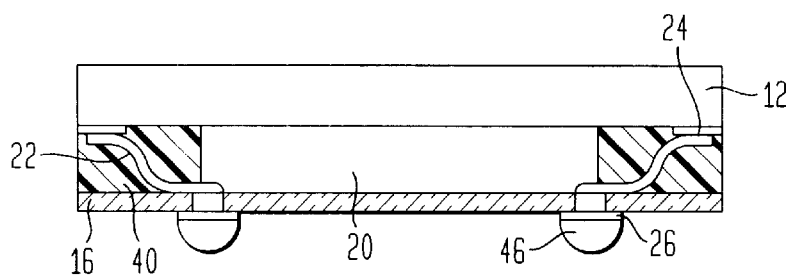
FIG. 4A is a side cross-sectional view of a singulated package assembly, according to the present invention.

A solder mask or coverlay 30 (referred to generically herein as "coverlay") is attached to the frame 42, and stretched taut across the aperture in the frame 42 to better ensure the dimensional stability of the substrate. The coverlay 30 is further attached to first surface 18 of the dielectric layer 16 so that it holds the chip assembly 10 in position within the frame 42. The coverlay 30 is preferably made of a photo-sensitive dielectric polymer material such as Dupont Pryralux PC 1025. The coverlay 30 is further typically adhesively attached to both the frame 42 and the dielectric layer 16, such as by using a vacuum lamination technique well known to those skilled in the art, so that the terminals 26 are protected from the encapsulant material 40 which is subsequently deposited, as described below. This can be accomplished by vacuum laminating the coverlay 30 over the terminals 26 or by providing apertures in the coverlay 30 which are aligned with the terminals 26 so that the terminals may be disposed therein (as shown in FIG. 1). Preferably, the terminals 26 are not rounded bumps (as shown) but are substantially flat pads on the surface of the dielectric layer 16, and may just be an extension and broadening out of leads 22. In such a flat terminal embodiment (such as shown in FIGS. 2 and 4A), a photosensitive coverlay 30 may be adhered to the first surface 18 of the dielectric layer 16 so that the portions of the coverlay 30 overlying the terminals may be removed using photolithographic techniques at a later time. The coverlay 30 may be attached to the frame 42 prior to attachment of the dielectric layer 16 of the chip assembly 10 or the chip assembly 10 may be attached to the coverlay 30 layer prior to the attachment of the coverlay layer 30 to the frame 42.

Once the semiconductor chip assembly 10 has been positioned and attached to the coverlay and ring, encapsulation material 40 is introduced into the open area between the frame 42 and the periphery of the semiconductor chip assembly 10. The encapsulation material 40 is comprised of a curable liquid which will allow the leads 22 to "flex" after the encapsulant material 40 has been cured in response to thermal cycling forces during operation of the finished package. In the preferred embodiment, the encapsulant is comprised of an electronic grade silicone-based elastomer or an epoxy-based resin; although, other materials may be used. The curing mechanism of the encapsulation material 40 will depend on the particular encapsulant material used so that the encapsulant can be cured or partially cured. Typical curing mechanisms are radiant energy, thermal energy, moisture or ultraviolet light.

The introduction of encapsulant material 40 may take place by using a needle-like dispenser 32 connected to an encapsulant source 34 (such as a CAM/ALOT programmable dispensing machine manufactured by Camelot Systems, Inc. in Haverhill, Mass.); although, this step could also be accomplished using other processes. Typically, the dispenser 32 is moved around the periphery of the chip 12 until the desired level of encapsulant material 40 has been substantially uniformly dispensed therearound; although, the dispensing operation need not be exact because the terminals 26 are protected from contamination by the coverlay 30 (covering the chip carrier 14) and the frame 42 (bounding the encapsulant material 40 on the sides). In the embodiment shown in FIG. 1, the encapsulant material is dispensed such that the level of the encapsulant material 40 is just below the plane of the back surface of the chip 12. If the frame 42 is not removed from the finished package, dispensing the encapsulant 40 to the level of the back surface of the chip 12 and then curing the encapsulant material allows the finished package to have more structural integrity.

The semiconductor chip package assembly and frame/encapsulant surrounding structure may then be attached to a PWB using a suitable conductive bonding material, such as eutectic solder. Alternately, a dicing means (such as a dicing saw, water jet, ultrasonic knife, rotary razor, laser, etc.) may be employed to separate the encapsulated chip assembly structure from the frame 42 so that the resultant chip package is no wider or only slightly wider than the periphery of the chip 12 itself. This allows for the option of having a protective "bumper" 44 of cured encapsulant material around the periphery of the semiconductor chip assembly as shown in FIG. 2. In such an embodiment, the dielectric layer 16 is juxtaposed with the contact bearing surface of the chip 12, as before; however, the dielectric layer 16 in the diced package embodiment shown FIG. 2 is larger than the contact bearing surface of the chip 12 such that it extends beyond the perimeter of the chip 12. The encapsulant 40 correspondingly extends beyond the chip perimeter to form a bumper 44 of encapsulant material. The bumper 44 further protects the edges of the chip and the metallurgy of the joint between the leads 22 and the contacts 24. The bumper also provides added durability to the package by protecting the sides of the chip 12.

Most preferably, the encapsulant material 40 is deposited such that it does not flow onto the back surface (non-contact bearing surface) of the chip 12. This allows the back surface of the chip to subsequently be connected to a heat sink or thermal spreader without an insulative material impeding the dissipation of heat from the chip 12 during thermal cycling. In some embodiments, the back surface of the chip 12 may be protected with a removable membrane, film or other layer to substantially reduce or eliminate the possibility of such contamination, as described in more detail in the embodiments discussed below.

Figure 3A:
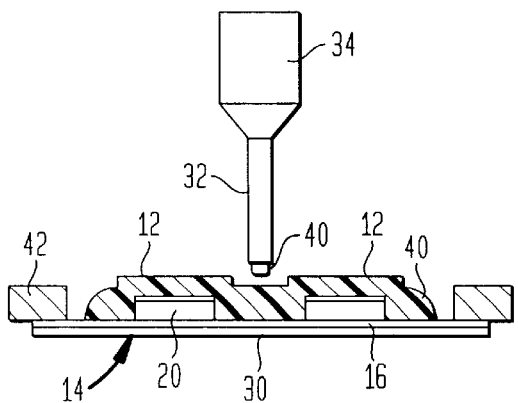
FIGS. 3A and 3B show various views of the encapsulation technique shown in FIG. 1 used with a plurality of devices on a common frame, according to the present invention.
Figure 3B:
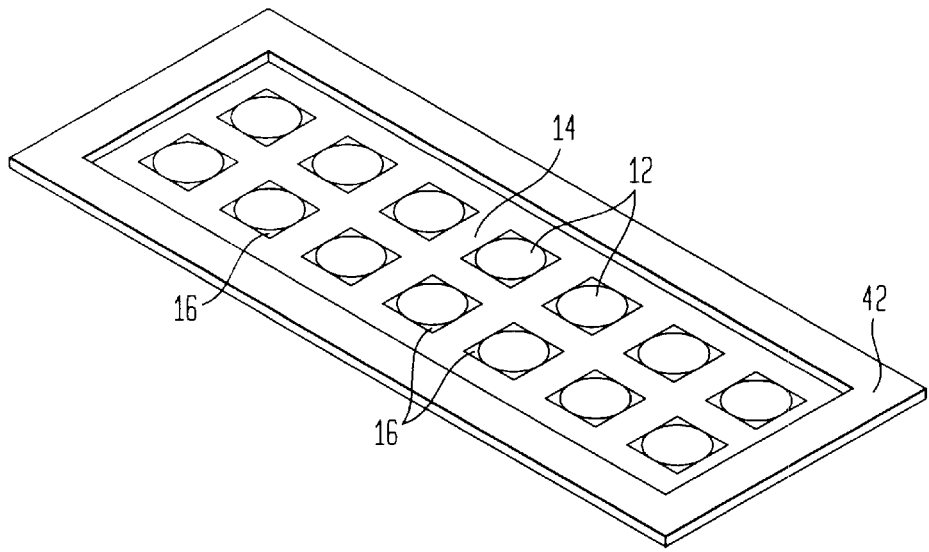
Figure 4B:
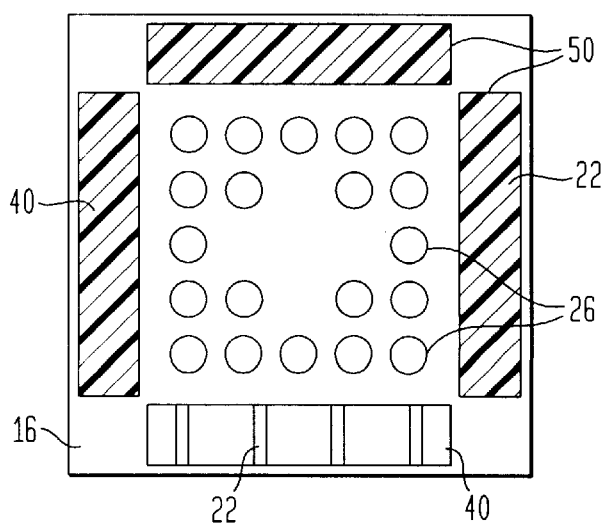
FIG. 4B is a face view of the chip package assembly shown in FIG. 4A, according to the present invention.

In an alternate embodiment shown in FIGS. 3A and 3B, the encapsulant can be dispensed so that it just covers the cavity between the leads 22, the compliant layer 20 and the dielectric layer 16 such that the cured encapsulant either is deposited to approximately the level of the contact bearing surface of the chip 12 or just protrudes slightly from the cavity between the chip 12 and the coverlay 30. In such an embodiment, the encapsulated chip assembly is typically diced so that the finished package is no larger than the periphery of the chip 12 itself, as shown in FIGS. 4A and 4B.

The embodiment shown in FIGS. 3A and 3B show that the encapsulation of the semiconductor chip assemblies 10 can be performed on a plurality of package assemblies 10 simultaneously, i.e. where the aperture in the frame 42 is large enough to accept many semiconductor chip assemblies 10 on the same coverlay 30. In this embodiment, it is preferable to have each chip 12 connected to the same chip carrier 14/coverlay 30 combination, as shown in FIG. 3A. Added manufacturing efficiency can be reached by encapsulating a plurality of such packages within the same frame by dispensing encapsulant in a first direction between and along the adjacent packages from one side of the frame 42 to the next before having to dispense in an orthogonal direction between and along such packages. The encapsulated chip assemblies may then be cut away or "diced" into individual chip packages or into interconnected multi-chip packages. The encapsulation of many chips 12 simultaneously is preferred to facilitate the mass production of finished packages. As described above, the encapsulant 40 is deposited from the chip side of the coverlay 30 and the coverlay ensures that the encapsulant 40 is bounded when it is deposited in liquid form such that it does not escape through possible bonding apertures 50 (FIG. 4B) and contaminate the terminals 26 and thus impede any subsequent electrical connection of the terminals to bond pads on a PWB. The frame 42 also acts as a barrier to provide a side boundary for the deposited encapsulant 40 should the need arise.

After the encapsulant has been deposited, the frame 42 can be placed within a temperature/pressure chamber so as to remove any possible voids or gas bubbles in the encapsulant and to cure the encapsulant material 40, as described in U.S. Pat. No. 5,834,339.

As described above, after the encapsulant material 40 has been cured, the semiconductor chip packages within the frame 42 are next separated (or "diced") from the chip carrier 14 into single packaged chips, such as that shown in FIGS. 2 and 4A, or the packaged chip may be diced into multi-chip modules.

The finished package shown in FIG. 2 has some benefits compared with the package shown in FIG. 4A. First, in FIG. 2, the dielectric layer 16 is extended to be the same size as the contact bearing surface of the chip 12. This allows the cured encapsulant layer 40 to have a substantially uniform thickness at every point between the chip 12 and the dielectric layer 16, even at the periphery of the package. This provides added support for the leads 260 during thermal cycling of the component as well as physical and environmental protection for the metallurgy of the connection between the leads 260 and the contacts 270. Further, as described above, the embodiment shown in FIG. 2 has a bumper 44 of encapsulant 40 for added physical and environmental protection.

Figure 5:
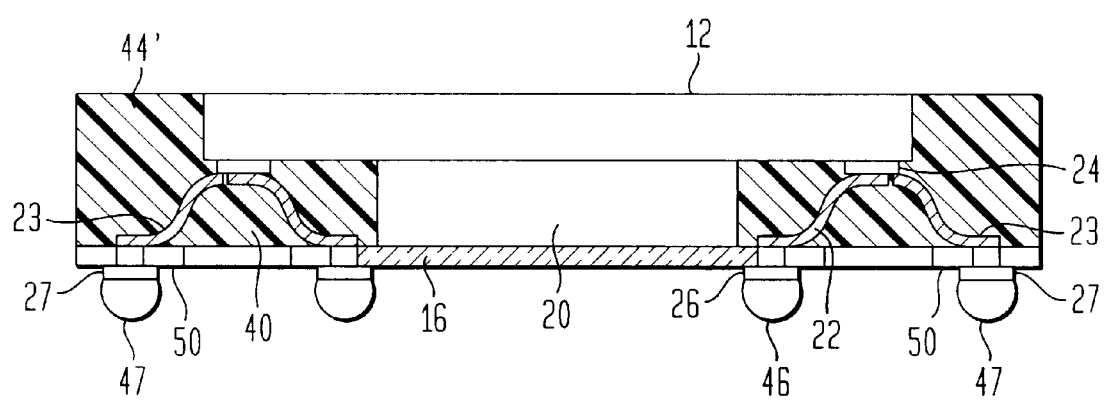
FIG. 5 is a side cross-sectional view of a singulated device having bumpers around the periphery of the chip package assembly and further having terminals beyond the periphery of the periphery of the chip, according to the present invention.

FIG. 5 shows a still further package embodiment which is diced such that it has extended bumpers 44' which support at least one outer row of terminals 27 which lie outside the periphery of the contact-bearing surface of the chip 12. The terminals 27 are electrically connected through leads 23 which are bonded down through the bonding apertures 50. A rigid back plate, typically made of a thermally conductive material, may be attached to the back surface of the chip and bumpers to add support to the outer row of terminals. Alternately, a rigid ring may be attached solely to the back surface and/or side surfaces of the bumpers thereby providing support to the outer row of terminals and further providing a direct thermal path to the back of the chip.

Figure 6A:
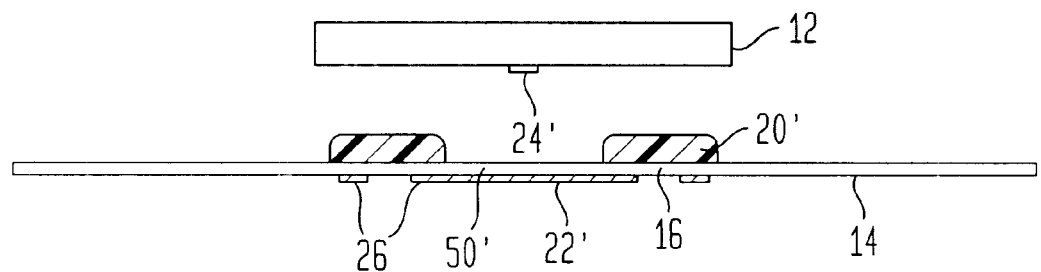
FIGS. 6A–6G show the process steps for encapsulating a center bonded semiconductor chip package assembly, according to the present invention.
Figure 6B:
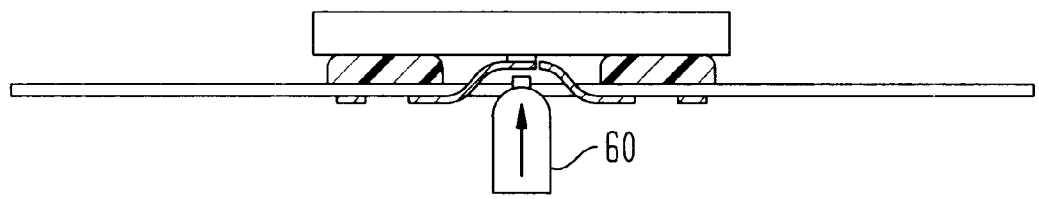
Figure 6C:
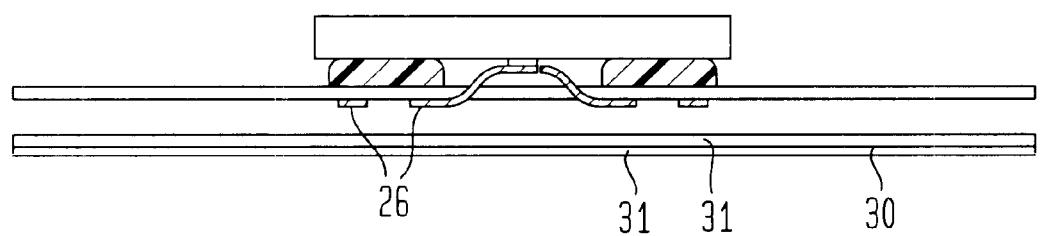
Figure 6D:
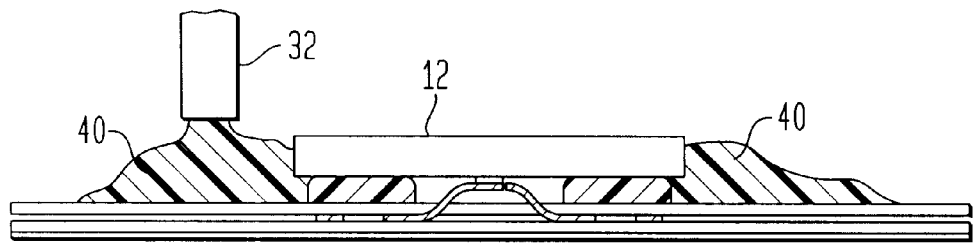
Figure 6E:
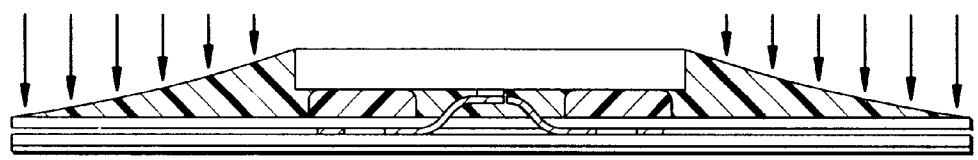
Figure 6F:
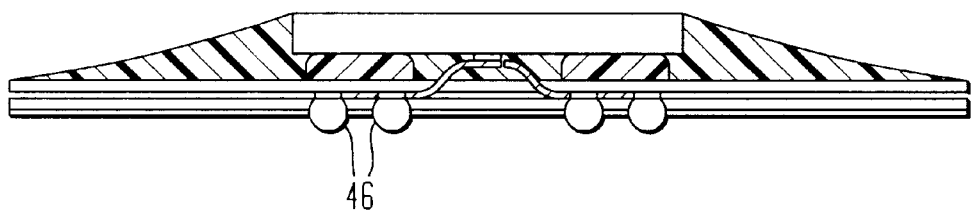
Figure 6G:
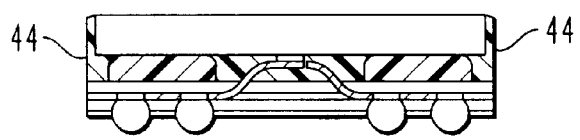

FIGS. 6A–6G show the process steps for encapsulating a semiconductor chip package, such as is described above, for a chip package embodiment which has chip contacts 24' that are located in the center of the face surface of the chip 12. In this embodiment, the compliant layer consists of two separate compliant pads 20' attached to the dielectric layer 16 and positioned on either side of the row of chip contacts 24'. Likewise, the leads 22' extend into the centrally located bonding aperture 50' and are aligned such that they may be bonded to respective chip contacts 24' using a bonding tool 60 and an appropriate energy source (such as ultrasonic, thermocompression or thermosonic energy), as shown in FIG. 6B. The leads 22' are bonded to the contacts 24' in somewhat of an interleaving pattern. As shown in FIG. 6C and described in more detail above, the coverlay 30 attached to the chip carrier 14 typically using a vacuum lamination technique. Apertures 31 in the coverlay 30 allow electrical connection with the terminals 26. In FIG. 6D, the dispenser 32 deposits a liquid encapsulant material 40 around the periphery of the chip 12. The amount or volume of the deposited encapsulant need not be tightly regulated; however preferably, the encapsulant material 40 does not get on to the exposed back surface of the chip 12, so that the chip 12 may dissipate heat more easily when the packaged semiconductor chip is in operation, as described above. In FIGS. 6E–6F, uniform pressure is applied to the outside of the assembly to create a uniform, substantially void/bubble free encapsulant layer by collapsing the voids/bubbles therein, as described in more detail in U.S. Pat. No. 5,834,339. FIG. 6G shows the packaged chip after it has been diced away from the rest of the encapsulant 40/chip carrier 14. This package has been diced to create the protective bumpers 44, shown in FIG. 2; however, it could be diced such that no bumper 44 exists.

Figure 7A:
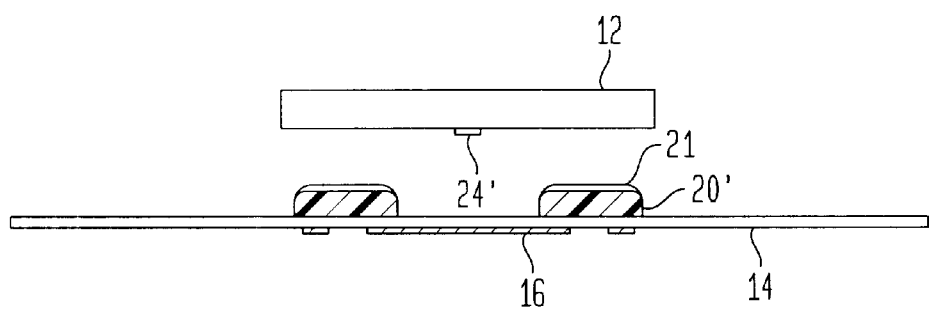
FIGS. 7A–7G show the process steps for encapsulating a center bonded semiconductor chip package assembly as shown in FIGS. 6A–6G with a flexible membrane attached thereto, according to the present invention.
Figure 7B:
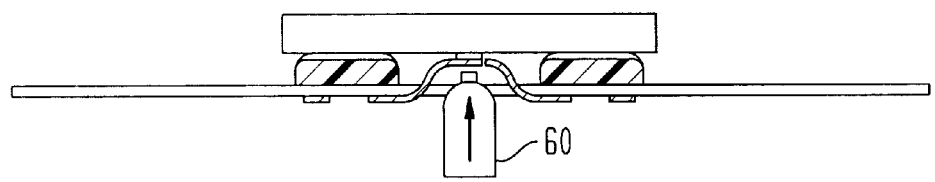
Figure 7C:
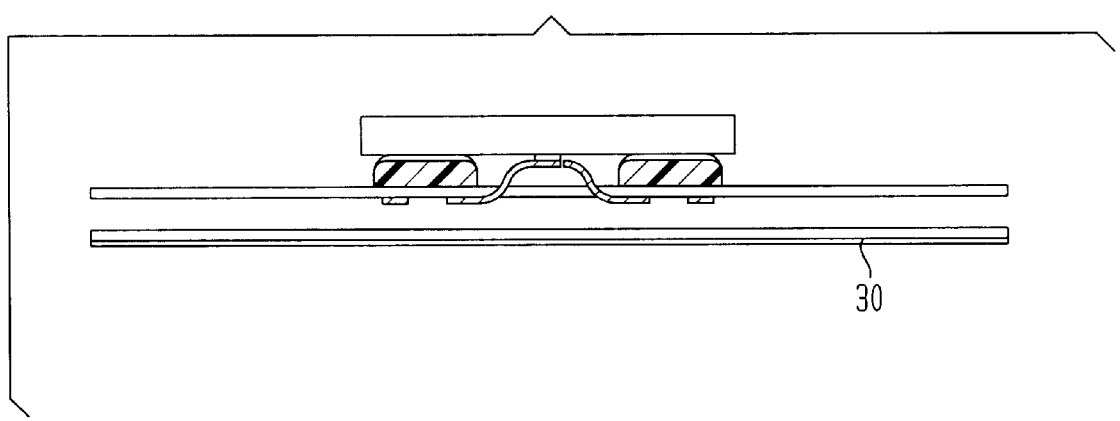
Figure 7D:
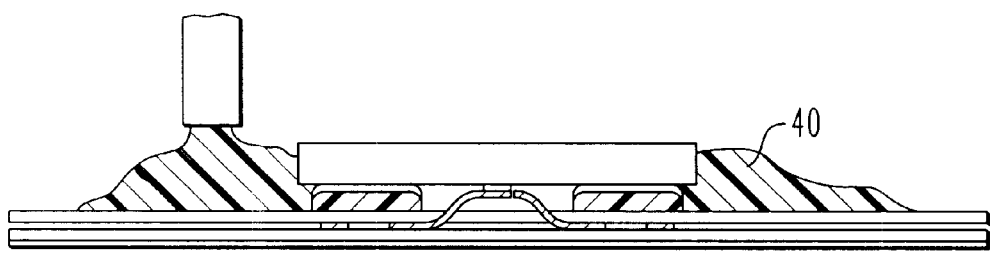
Figure 7E:
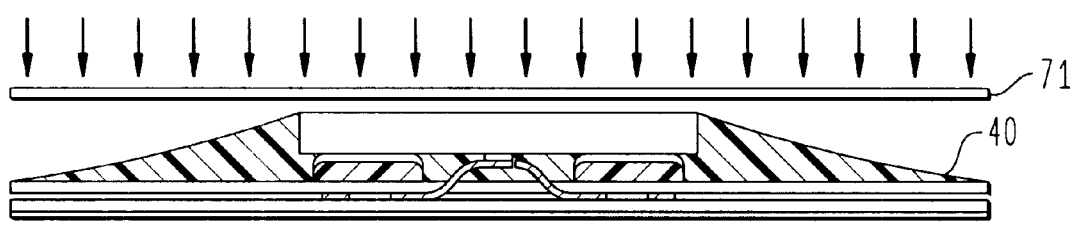
Figure 7F:
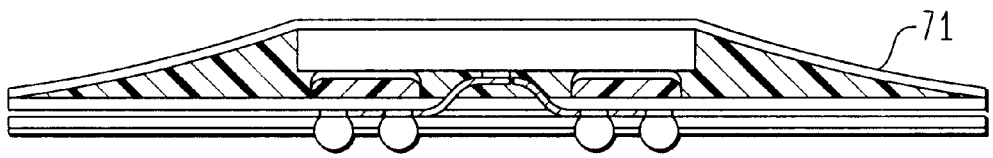
Figure 7G:
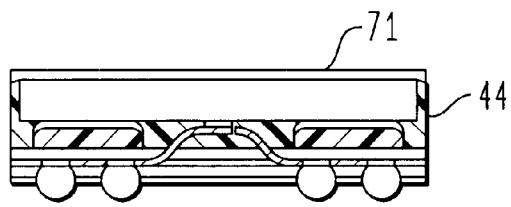
Figure 9A:
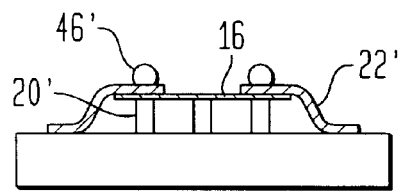
FIGS. 9A–9D show the process steps for encapsulating a semiconductor chip package assembly in which the chip carrier is encapsulated leaving only the raised terminals to protrude from the face surface of the chip package, according to the present invention.
Figure 9B:
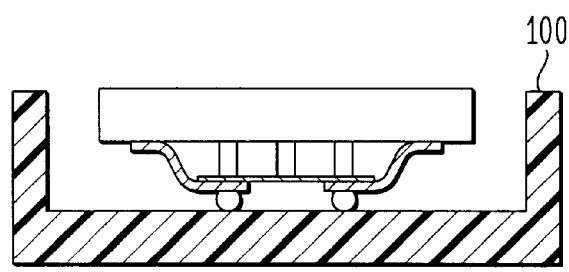
Figure 9C:
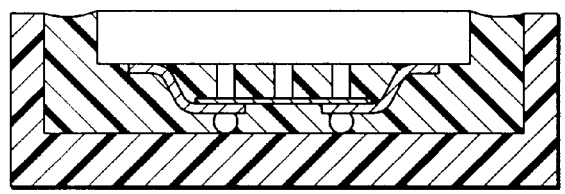
Figure 9D:
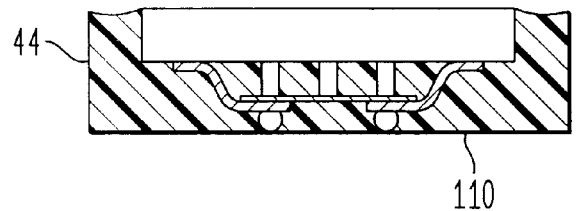
Figure 10A:
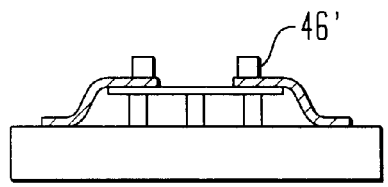
FIGS. 10A–10D show a process similar to that shown in FIGS. 9A–9D except that the raised terminals are removed after the encapsulation/cure steps, according to the present invention.
Figure 10B:
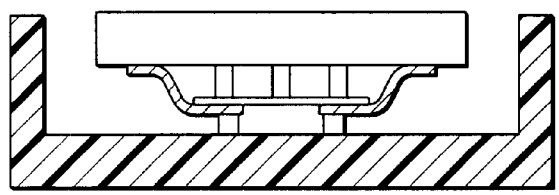
Figure 10C:
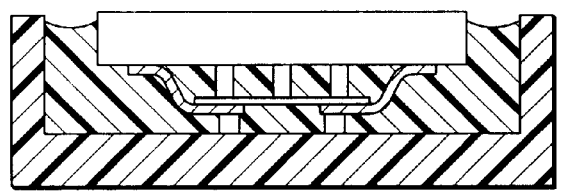
Figure 10D:
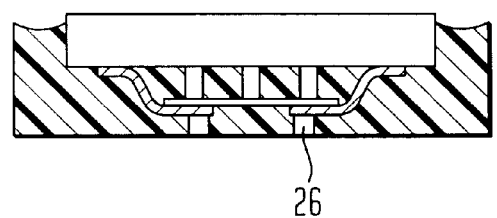

FIGS. 7A–7G show a variation in the process shown in FIGS. 6A–6G where a membrane 71 may be applied or deposited in a sheet form atop the assembly, as shown in FIGS. 7F and 7G. The membrane is flexible and is biased such that it comes into intimate contact with the back surface of the chip 12, and preferably is laminated or otherwise attached thereto. The portions of the membrane 71 beyond the periphery of the chip 12 may be used to mechanically force the encapsulant around the leads 22' and beneath the chip 12 (if required). The membrane 71 also helps to ensure that encapsulant 40 does not get onto the back surface of the chip 12, as described above. After the encapsulant is cured, the membrane 71 is typically sealed to the back of the chip 12 and cured encapsulant. After the assembly has been diced, the membrane protects the back surface of the chip 12 and further binds the bumper portions 44 so that they do not de-laminate from the side edges of the chip 12, as shown in FIG. 7G. The membrane 71 may be comprised of thermally conductive material (such as a heat bondable thermal conductor) such that a cooling surface or heat sink may be attached thereto. Alternately, the membrane 71 may be removed from the back of the die leaving the back surface of the chip 12 bare to be subsequently attached to a cooling surface or heat sink.

Figure 8:
FIG. 8 is a side cross-sectional view of a singulated device having bumpers around the periphery of the chip package assembly and further having a protective membrane attached to the exposed surfaces of the chip and bumpers, according to the present invention.

In a variation such as is shown in FIG. 8, a membrane 70 is applied in a sheet form around the exposed surfaces of the chip 12 and bumpers 44 after the dicing step typically using, a vacuum lamination technique, in effect, laminating the membrane 70 to the back surface of the chip and exposed surface of the bumpers 44. Such a membrane 70 may be permanently sealed to the back of the chip protecting the chip and further binding the bumper portions so that they do not de-laminate from the side edges of the chip. This may be used in conjunction with other packages variations, such as shown in FIG. 5. Alternately, the membrane 70 could just be attached to the exposed back of the chip and the tops of the bumper portions without wrapping around the exposed sides of the bumpers.

FIGS. 9A–9D show an overmolded encapsulation technique similar to that described above except that the encapsulant 40' completely encompasses the dielectric layer 16' thereby allowing only the raised terminals 46' to be exposed. Using this technique, the chip 12 is assembled to the chip carrier 14, as described above. In these figures, the compliant layer has been replaced by a plurality of compliant pads 20' which provide a stand off or gap between the substrate 16, and the contact bearing face surface of the a semiconductor chip 12, as further described in U.S. Pat. Nos. 5,659,952 and 5,834,339, the disclosures of which are hereby incorporated by reference. Raised terminals 46' lie above the terminal pads 26'. This assembly is then placed terminals first into a mold. The raised terminals provide a stand-off between the substrate and the mold 100. Encapsulant material 40 is then introduced into the mold such that at least a portion of the raised terminals 46' are protected from the encapsulant 40. This can be accomplished any number of ways, such as providing recessed areas in the mold for receiving the raised terminals. The construction of the mold 100 is not critical so long as it does not impede the flow of the encapsulant material 40. After the encapsulant has been deposited such that it encapsulates the entire package (or packages if a plurality of packages are being simultaneously encapsulated) including the front surface of the dielectric layer 16, the encapsulant is cured and the mold 100 is removed. The removal of the mold can be accomplished by dissolving the mold or making the mold such that the encapsulant material 40 does not wet to its surface. This produces a package which has a front face 110 completely comprised of the cured encapsulant material except for the raised terminals. The packages are then separated or diced from the frame 42 or each other as needed.

FIGS. 10A–10D show a process for encapsulating which is substantially similar to that shown in FIGS. 9A–9D except that sacrificial raised terminals 46" are used. After the package has been encapsulated in the mold, the mold 100 is removed. The sacrificial terminals are then also removed, typically by a dissolving or etching process. Solderballs or other connection means can then be directly attached to the terminals 26. The parts are then separated from the frame 42 as needed.

Figure 11:
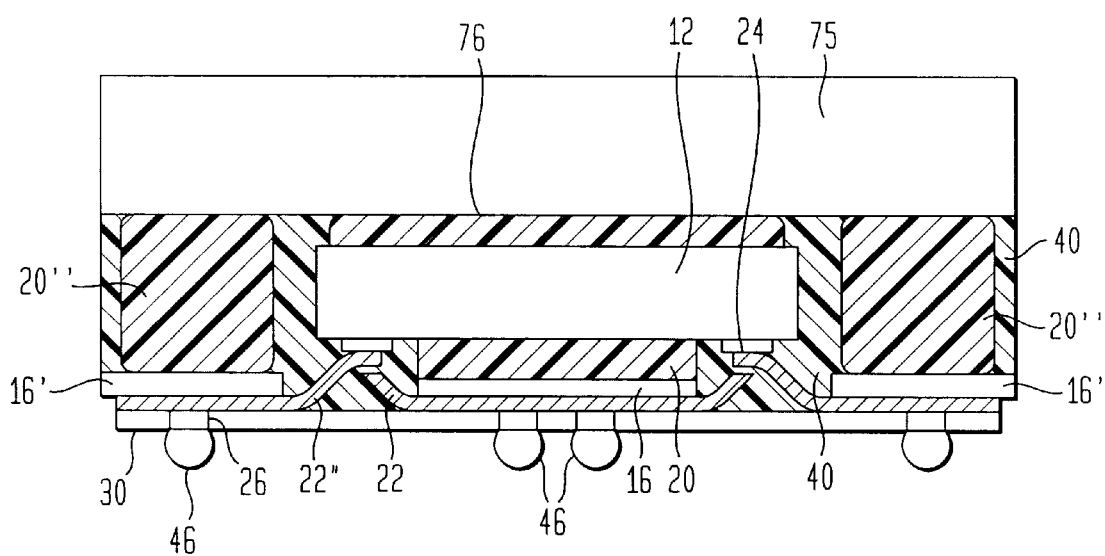
FIG. 11 shows a cross-sectional side view of a so called-fan-in/fan-out embodiment of the present invention.

FIG. 11 shows a cross-sectional side view of a so-called fan-in/fan-out embodiment of the present invention. As shown, a fan-in/fan out package has terminals 26 which both overly the chip surface and are also positioned beyond the periphery of the chip 12 on the dielectric substrate layer 16/16'. Here, the chip 12 is attached to a rigid, thermally conductive plate 75, typically using conventional thermally conductive die attach adhesive 76, such as a silver filled epoxy or the like. The dielectric layer 16 overlies both the face surface of the chip 12 and a surface of the rigid plate 75 and is adhered to each such surface with a compliant layer 20/20". As described above, compliant layer 20 may be comprised of a single layer/pad or a plurality of pads/posts and compliantly supports the dielectric layer 16. Compliant layer 20" also compliantly supports the outer dielectric layer 16' and is preferably comprised of a plurality of pads/posts 20" which are positioned around the outer periphery of the chip 12 such that the outer dielectric layer 16' is somewhat uniformly supported. The conductive leads 22/22" are then bonded through the bonding apertures 50 to respective chip contacts 24 typically using an interstitial lead design, where adjacent leads are connect ed to opposite dielectric layers 16/16'. The leads interconnect respective terminals 26 and chip contacts 24. After the leads are bonded, the coverlay 30 is placed over the exposed surface of the dielectric layers 16/16' such that the bonding apertures 50 are sealed. Encapsulant material 40 is then deposited around at least a portion of the periphery of the assembly. The encapsulant flows into and between the pads 20" so as to create a substantially void/bubble free encapsulant layer between and around the other package elements. The encapsulant is then cured and the package is diced. The embodiment shown in FIG. 11 can be produced one at a time. Preferably, however, it is produced using a panel process, as described above, such that many chips 12 can be packaged simultaneously. In such a plural embodiment, the bumpers 44, described above, could also be disposed around the outside periphery of the package such that the peripheral edges of the rigid plate 76 in the resulting package are covered by cured encapsulant. Obviously, the embodiment shown in FIG. 11 could also be used to produce a fan-out only (no terminals overlying the chip) chip package.

Figure 12A:
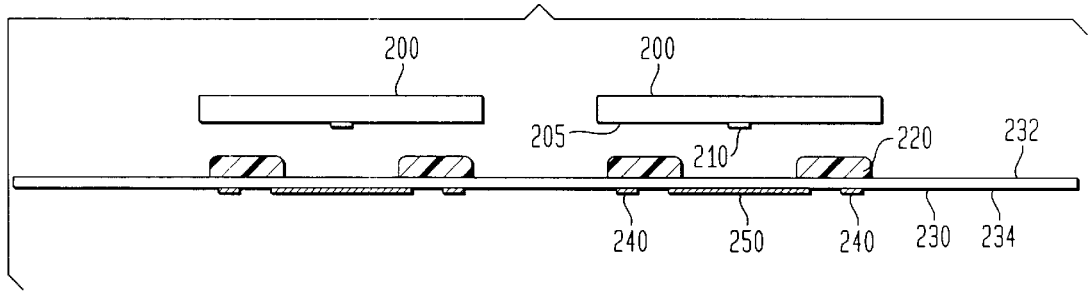
FIGS. 12A–12G show the process steps for manufacturing a center bonded semiconductor chip package assembly and the resulting package structure, according to the present invention.
Figure 12B:
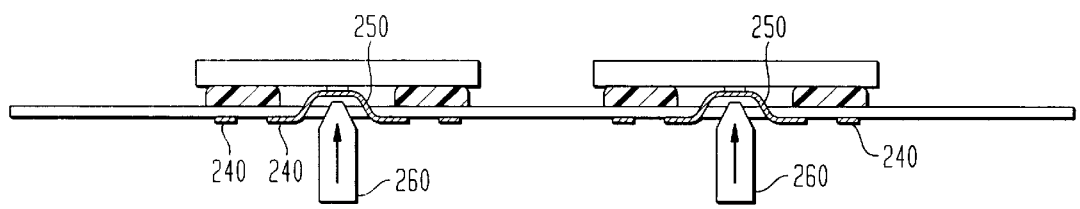

FIGS. 12A through 12G show process steps for simultaneously manufacturing a plurality of semiconductor chips having a ring-like support structure as discussed in reference to FIG. 5, above. In this embodiment, the chips 200 have chip contacts 210 that are located in a center region of the face surface 205 of the chip 200, similar to the embodiment shown in FIGS. 6A–6G. Multiple chips 200 are attached to a single substrate 230 through the use of compliant layers 220. The compliant layers consist of multiple compliant stand-offs or pads which are disposed on either side of the chip contacts 210. Preferably, the substrate 230 is made of a flexible, sheet-like substrate, such as polyimide, and is attached at its edges to a frame and held somewhat taut by the frame, such as is shown in FIGS. 1, 3A and 3B. The substrate 230 has a first surface 232 facing towards the chips 200 and a second surface 234 facing away from the chips 200. There are electrically conductive terminals 240 and leads 250 on the substrate. However, there may also be other structures such as ground and power planes on one of more of the substrate surfaces. Typically, the leads 250 are aligned with respective chip contacts 210 by spanning across one or more bonding windows which allow the leads 250 to be bonded to the contacts 210 using a conventional bonding tool and an appropriate energy source (such as ultrasonic, thermocompression or thermosonic energy), as shown in FIG. 12B. The leads 250 shown in FIG. 12B are bonded to the contacts 210 in somewhat of an interleaving pattern such that the terminals 240 on either side of the bonding window (s) may be electrically connected to respective contacts 210. Other types of leads and lead bonding may be used, such the leads and bonding techniques described in commonly assigned U.S. Pat. No. 5,518,964 the disclosure of which is incorporated by reference herein.

Figure 12C:
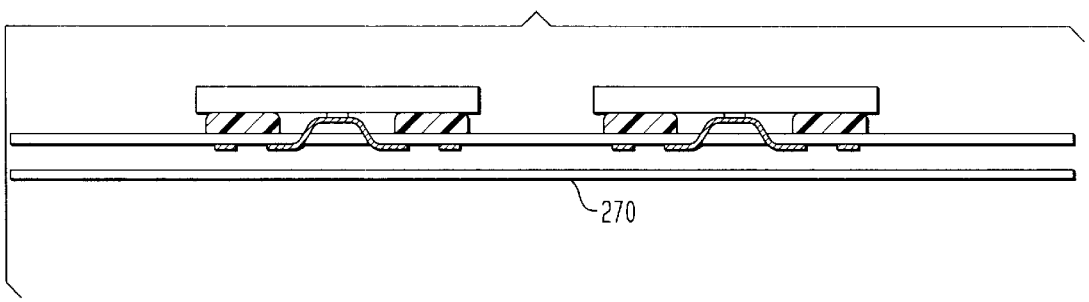
Figure 12D:
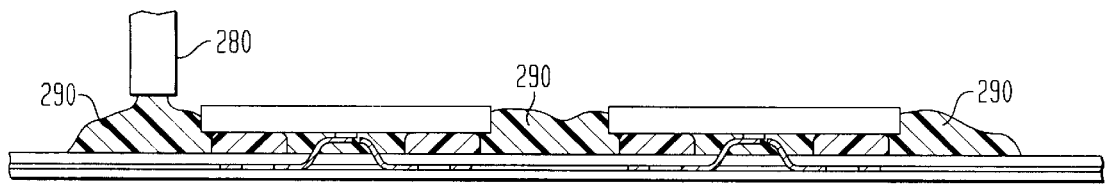
Figure 12E:
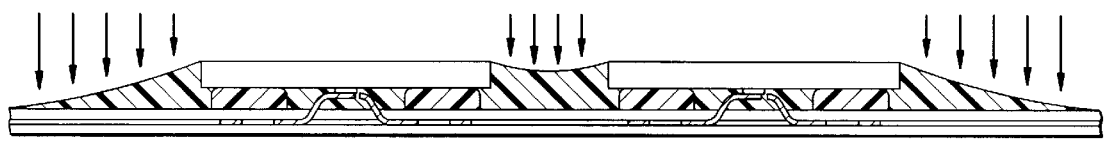
Figure 12F:
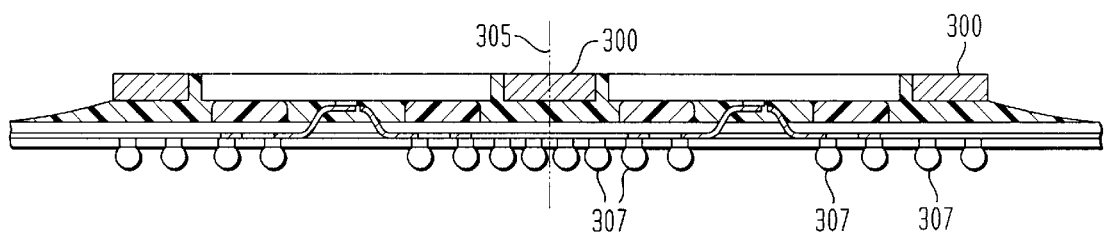
Figure 13A:
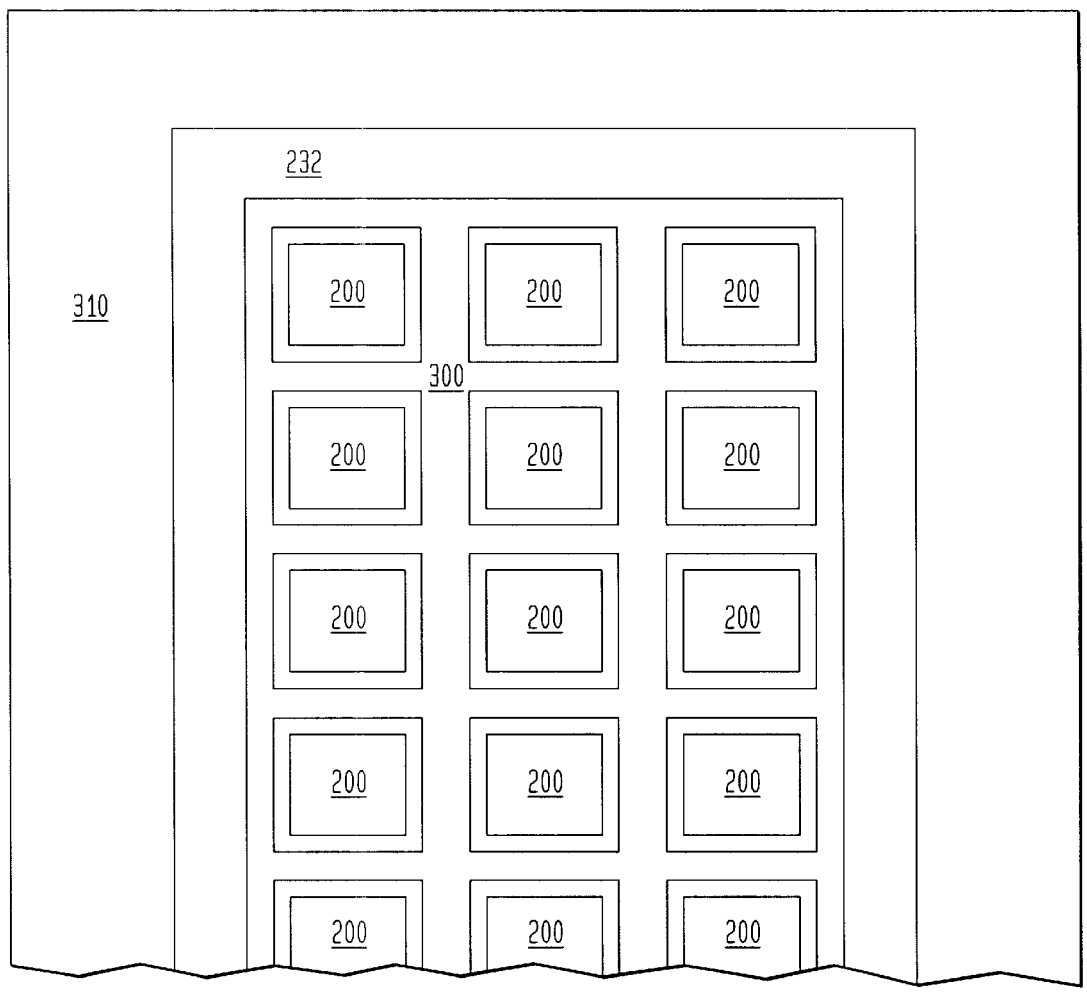
FIG. 13A shows a top plan view of a semiconductor chip assembly having a unitary support structure, according to the present invention.
Figure 13B:
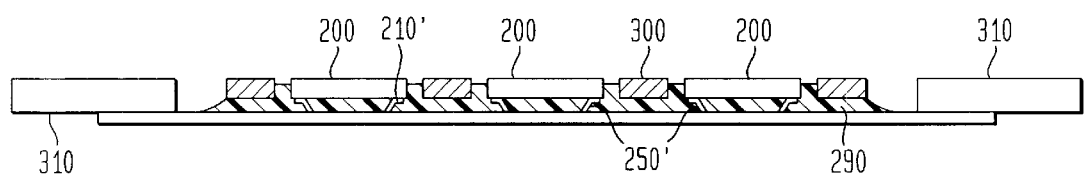
FIG. 13B is a cross-sectional side view of the semiconductor chip assembly in FIG. 13A.

As shown in FIG. 12C, a coverlay 270 is typically attached to the second surface 234 of the substrate 230 to seal the bonding window. There may also be one or more apertures in the coverlay 270 to expose the terminals 240 and allow for subsequent electrical connection thereto. In FIG. 12D, a dispensing needle 280 deposits a curable, liquid encapsulant material 290 around the periphery of the chip 200. The amount or volume of the deposited encapsulant material 290 need not be tightly regulated; however preferably, the encapsulant 290 does not get on to the exposed back surface of the chip 200, so that the chip 200 may dissipate heat more easily when the packaged semiconductor chip is in operation, as described above. In FIGS. 12E and 12F, the encapsulant material is allowed to wick between the compliant pads 220 and beneath the chip 200 to create a substantially uniform, void-free encapsulant layer. In FIG. 12F, after the encapsulant material has been allowed to flow around the compliant layer and between the chip 200 and the substrate 230, a unitary support structure, such as the ring grid 300 having a plurality of apertures therein for receiving the chips 200 (as also shown in FIGS. 13A and 13B), is attached to the exposed encapsulant material 290 along side and around the chips 200 and preferably at least partially embedded therein. However, in other preferred embodiments, the unitary ring grid 300 is attached prior to depositing the encapsulant material 290 and the encapsulant material 290 is deposited after the ring grid 300 and is allowed to wick around and under the chip assembly or is pressurized to force the encapsulant under the chip assembly. In certain preferred embodiments, the compliant layer is comprised of a plurality of compliant pads which are attached or deposited on the first surface 232 of the substrate 230 beyond the periphery of the chip 200 such that the compliant pads are also located on a region of the tape where the ring grid 300 will be attached, such as shown in FIG. 15A. These additional compliant pads may be attached or deposited on the substrate 230 when the rest of the compliant layer 220 is attached or deposited thereon. Placing the compliant pads under the ring grid area will set a minimum height or standoff from the ring grid 300 to the substrate 230 and will help to maintain the ring grid in a plane parallel to the substrate (as shown in FIG. 3B).

Figure 12G:
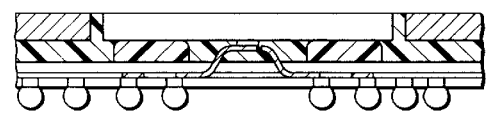

After the encapsulant material 290 has underfilled the assembly structure, the encapsulant material 290 is then typically fully cured. Solder balls 307 are next typically attached and reflowed on the terminals 240 so that the chips may be attached to supporting substrates, such as printed wiring boards. Processing all of the chip packages on a frame greatly reduces the time it takes to place the solder balls 307 on each of the packages. The cut-line 305 shows where the ring grid 300 and the rest of the package assembly will be next cut to separate the packaged chips (as shown in FIG. 12G) into individual chip packages or into multi-chip assemblies (not shown). Although not shown in the figures, the ring grid 300 may be cut during the chip package singulation operation such that portions of the ring grid 300 are scrapped (not part of the finished chip package) so that the dimensional outline of the chip package may be reduced or increased by the singulation operation, i.e. by multiple cut or singulation lines. This way, the same ring grid 300 may be used in the packaging of similarly sized chips 200 where the chips may require more or less ring grid 300 width to support the terminals 240/solder balls 307 that reside outside the periphery of the chip 200.

Figure 13C:
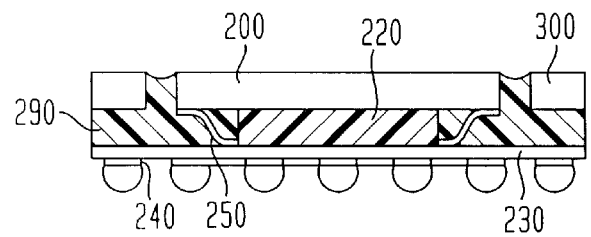
FIG. 13C is a cross-sectional side view of the resulting chip package assembly in FIG. 13A after singulation.

FIG. 13A shows a top plan view of an array of chips that are being packaged according to the process described in reference to FIGS. 12A–12F, except that three chips 200 are disposed in each row of chips 200 and attached to the first surface 232 of the substrate 230. The substrate is attached to and held somewhat taut by the frame 310, as described in the above embodiments. The unitary ring grid 300 has a plurality of apertures therein which may be aligned with respective chips 200 on the substrate 230 after the encapsulant (not shown) has been dispensed around the periphery of the chips 200. The ring grid 300 is attached to the encapsulant material 290 and may also be at least partially embedded therein, as described above. FIG. 13B shows a side view of the total assembly, similar to the side view shown in FIG. 12F. The chips 200 in FIG. 13B can be seen to have contacts 210' in peripheral regions of the front surface 205 of the chip 200, as compared to the center contacts 210 shown in FIG. 12A and the compliant layer is comprised of a single unitary layer of compliant material. The leads 250' thus are also located on a different portion of the substrate 230 such that they align and may be connected to respective chip contacts 210'. FIG. 13C shows a chip package after it has been singulated from the frame 310.

The ring grid 300 may be comprised of virtually any type of rigid or semi-rigid material. It may be thermally conductive or insulative. Since the registration of the apertures to the chips 200 is not hyper-critical, the unitary ring grid may be made by a low cost stamping operation, etching operation or molding operation, among others. Examples of ring grid materials include copper alloys, stainless steel, paper phenolic, liquid crystal polymer, epoxy or other polymer based materials. Preferably, however, it is made from a material which is both low cost and rugged so that the resultant package can withstand standard surface mount handling operations without damage to the package. Further, the ring grid 300 and the frame 310 could be made as a single unitary piece which would allow for a single low cost stamping or molding operation to create the combination of these features.

Figure 14A:
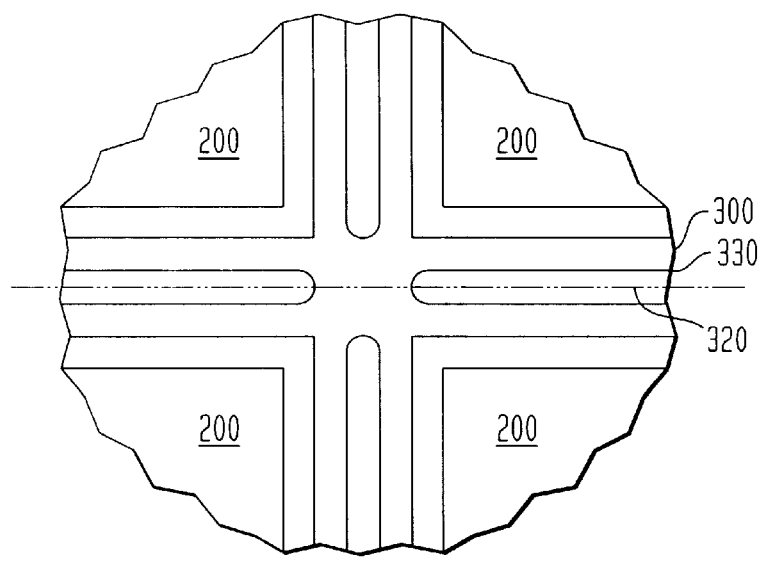
FIGS. 14A–14D is a fragmentary top plan view showing various unitary support structures, according to the present invention.
Figure 14B:
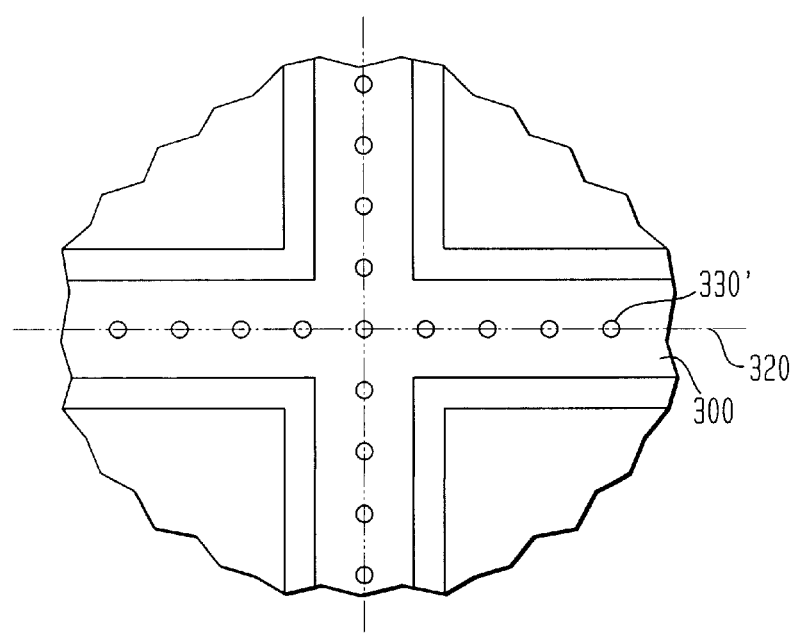
Figure 14C:
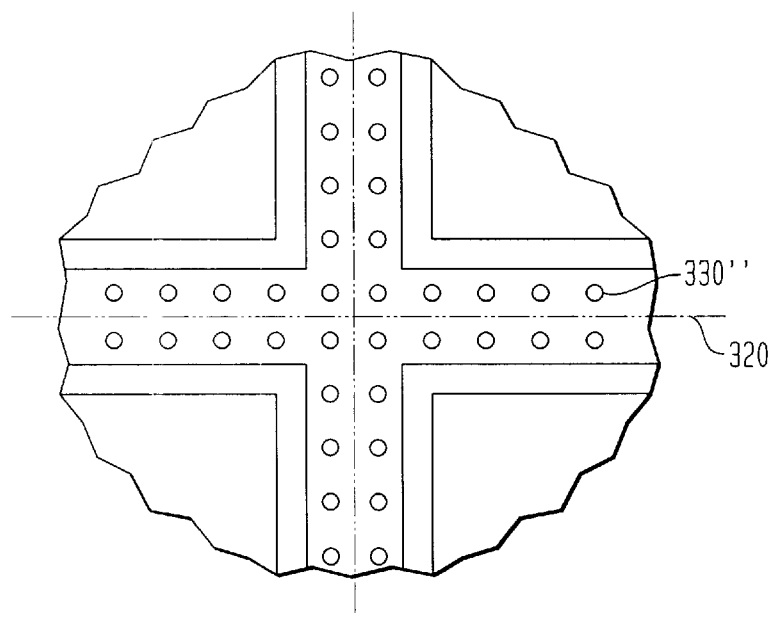
Figure 14D:
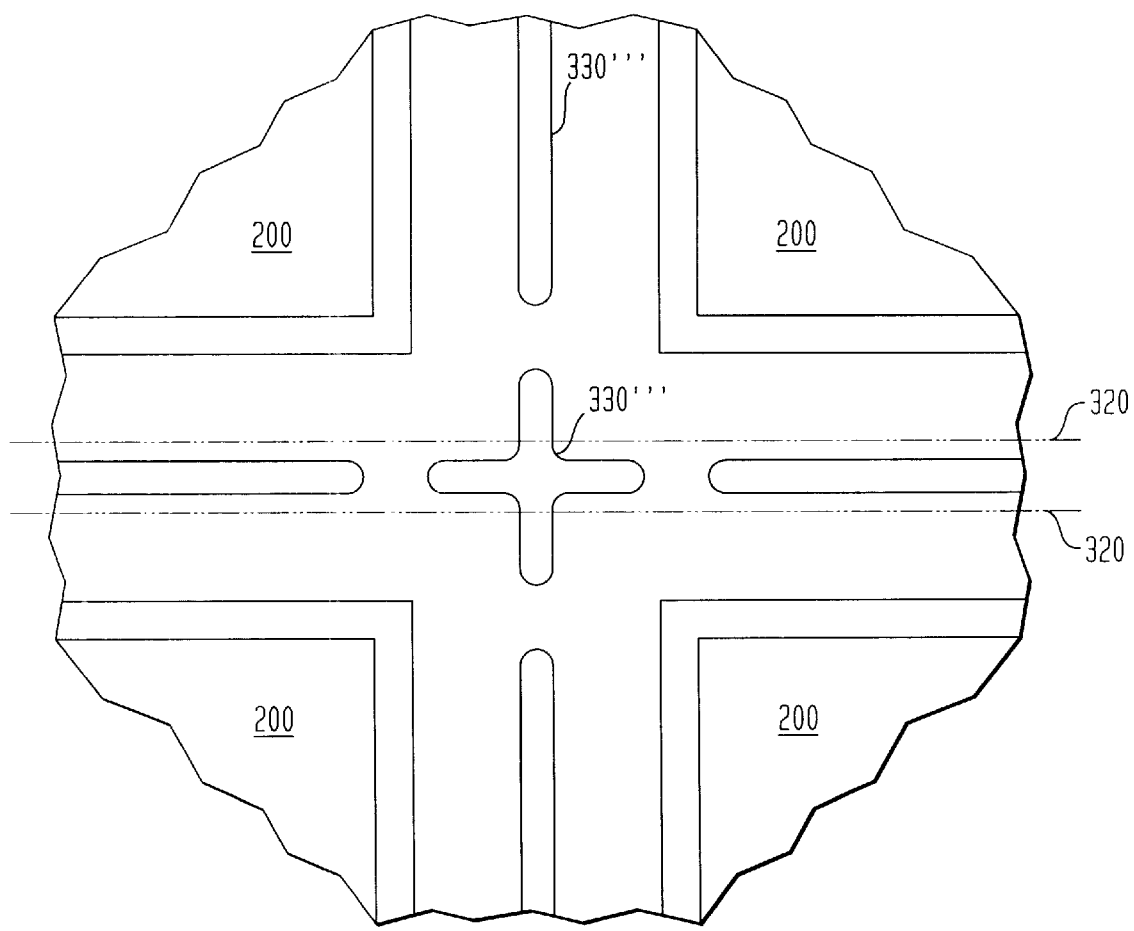

As shown in FIG. 14A, the ring grid may have elongated slots 330 extending through the ring grid which are centered along the eventual cut line 320 to allow the voids/gas bubbles to escape from underneath the ring grid 300. FIG. 14B shows a plurality of holes or apertures 330' along the cut line 320, instead of the elongated slots, in the ring grid 300 to allow for the voids to escape from the encapsulant 290. These slots and apertures in the ring grid 300 also perform the function of partially perforating the cut line 320 of the ring grid 300 to facilitate the singulation of the chip packages. However, since these slots/apertures are along the eventual cut line 320 of the package, they may give the top of the package a jagged look (like the edges of a US postage stamp). FIG. 14C shows that the slots or apertures 330" may also be off-set from the cut line 320 such that the voids/gas bubbles may escape from the encapsulant 290 under the ring grid 300 while still allowing the singulated package to have a smooth periphery. FIG. 14D further shows that the slots/apertures 330''' may be centrally located while multiple cut lines 320 are offset from the slots 330''' such that the resulting chip package will have a smooth exterior. Other slot/aperture shapes and locations are also possible.

The unitary ring grid 300 may also be made of several independent ring grids each of which surround more than one chip. For example, if there are ten 8 mm square chips aligned and attached in two columns in a first region of the tape 230 and eight 10 mm by 6 mm rectangular chips aligned and attached in two columns to a second region of the tape 230, it may prove more useful and may be easier to align and attach two separate ring grids 300 on a single frame assembly. Depending on the length of the tape 230 on the frame 310 and the types of chips 200 attached thereto, three or more ring grids 300 may also be used.

As shown in FIGS. 15A, another variation on the process and structures set forth above may include a sheet-like, thermal spreader 340 attached to the exposed major surface of the ring grid 300 and the back surface of the chip 200, such as by using a thermally conductive epoxy or silicone die attach material, as shown in FIG. 15A (similar to the embodiment show in FIG. 11). In one embodiment, a thin layer of die attach 350 is used such that there may be voids between the thermal spreader 340 and the encapsulant 290. Preferably, however, the die attach 350 is thick enough to flow into the areas between each ring grid 300 and chip 200 combination such that the open areas or voids therebetween are reduced or eliminated. A pressure and heat treatment as described in U.S. Pat. No. 5,834,339 may also be used to get rid of any remaining voids between the thermal spreader and the ring grid/chip combination.

FIG. 15B shows a further variant in which the ring grid 300 and thermal spreader 340 have been integrated into a unitary grid of package caps 360 which provide a rugged package exterior back surface and also has plural protruding support 365 on the sides of the chip 200 to perform the function of the ring grid to support the terminals 240 outside the periphery of the chip 200. As shown FIG. 15B, the grid of caps 360 may include recessed areas 370 on the exposed exterior of the caps 360 above the protruding supports 365 to facilitate the singulation operation and to provide a more aesthetically pleasing package exterior. Further, the grid of caps 360 (and for that matter the sheet-like spreader 340 and/or the ring grid 300) may be made of an inexpensive material which is not a good thermal conductor, such as a plastic or other type of polymer thereby better allowing for the injection molding of the part prior to its attachment to the rest of the packages.

Typically, the aforementioned thermal spreader 340 (FIG. 15A) or cap 360 (FIG. 15B) would be attached to the ring grid 300 and the chips 200 after all other processing has been done but prior to the singulation step, such that when the packages are singulated each has a individual thermal spreader 340 or cap 360 that defines the size of the overall chip package.

Figure 16:
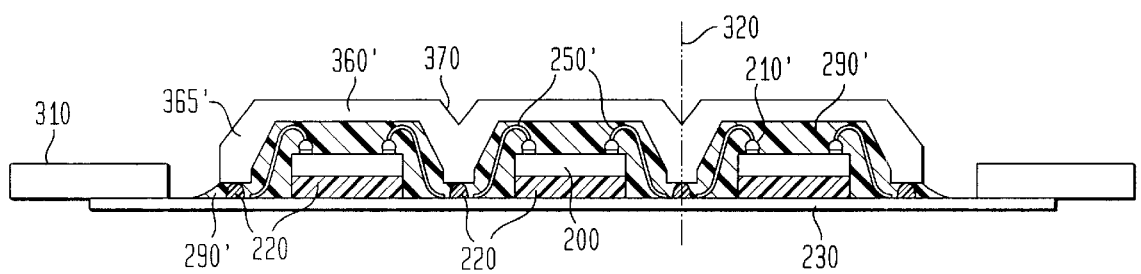
FIG. 16 shows a cross-sectional side view of another semiconductor chip assembly, according to the present invention.

The idea of a ring grid and/or combination with a thermal spreader or integration with a cap (a described above) may also be used where the chip 200 is oriented such that its contacts 210' and the face surface 205 of the chips 200 are oriented away from the substrate 230. FIG. 16 shows an embodiment where each of the chips 200 have been attached to the substrate 230 by the compliant layer 220 and the chip contacts 210' are electrically connected to the leads and terminals on the substrate 230 through the use of conventional wire bonds 250'. Next, an encapsulant material 290' is deposited around the individual chip assemblies such that the wire bonds 250' are fully covered by the encapsulant material 290'. The encapsulant material 290 in this embodiment could be compliant, such as a silicone, or it could be more of a rigid encapsulant, such as an epoxy or the like. Typically, the encapsulant materials 290 is loaded with particulate material to make the encapsulant more thermally conductive.

A grid of caps 360' is next placed over the encapsulant 290, as shown, before the encapsulant 290' is fully cured to allow the encapsulant 290' to wet or adhere to the cap 360'. Compliant pads 220 may be deposited or attached such that they help to planarize the grid of caps 360' with respect to the tape/frame assembly and further set the minimum height from the tape to the protruding supports 365'. Typically the cavities in the cap will need to be deeper that the corresponding cavities shown in FIG. 15B because of the upwardly protruding wire bonds 250'. The grid of caps 360' may also have apertures or slots extending therethrough to help to vent any entrapped voids or bubbles at the junction of the encapsulant 290' and the caps 360'. Also, a pressure and heat treatment as described in U.S. Pat. No. 5,834,339 may be used to minimize such voids and/or bubbles.

Further, the grid of caps 360' may be comprised of a material which has a coefficient of thermal expansion similar to that of the chip 200 so as to constrain the movement of the wire bonds 250' thereby relieving mechanical stress and strain forces thereto, as described in more detail in U.S. patent application Ser. No. 08/962,988 hereby incorporated by reference herein. The idea here is to "tune" the coefficient of expansion of the caps 360' so that if the caps 360' and chip 200 have similar coefficients of thermal expansion, both will tend to expand and contract by approximately the same amounts during temperature changes. Thus, the movement of the portion of the encapsulant 290 that surrounds the wire bonds 250' and the wire bonds 250' themselves are constrained between the spreader and the chip 200. The encapsulant in this region thus tends to move with the chip 200 and the caps 360'. Therefore, there is a reduction in shear strain in the encapsulant 290. Accordingly, the relatively delicate wire bonds 250' are effectively protected from flexure during thermal cycling. Desirably, the linear coefficient of thermal expansion of the caps 360' is between about 50% and about 200% of the linear coefficient of thermal expansion of the chip. For a conventional silicon chip having a linear coefficient of thermal expansion of about $3 \times 10^{-6}$ cm/cm-° C., the linear coefficient of thermal expansion of the caps 360' therefore is desirably is between about 1.5 and about $6 \times 10^{x6}$ cm/cm-° C. Examples of cap 360' materials which may be used in this way are Invar, Copper/Invar, Alloy 42, Tungsten/Copper. Also, the encapsulant 290 can be loaded with particulate material in order to bring its coefficient of thermal expansion closer to that of the chips 200 in order to give better stress relief for the wire bonds 250'.

Figure 17A:
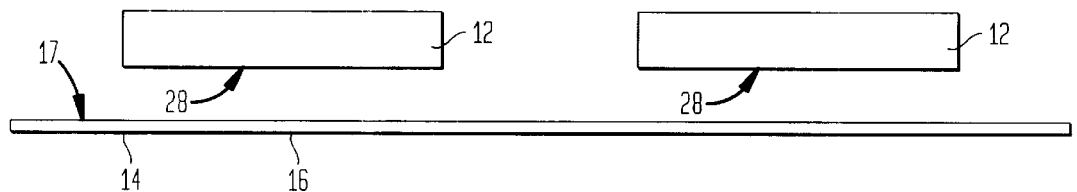
FIGS. 17A–17E, and 17G–17I show progressive steps in a method according to one embodiment of the present invention of packaging a semiconductor chip using a support structure made in situ.
Figure 17B:
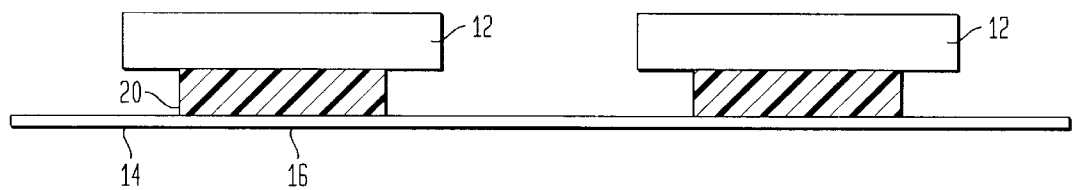
Figure 17C:
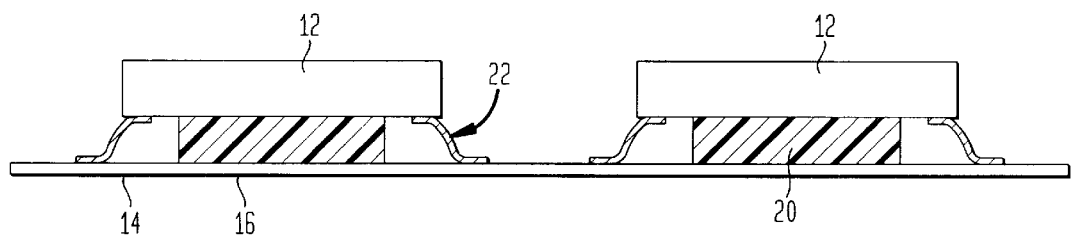
Figure 17D:
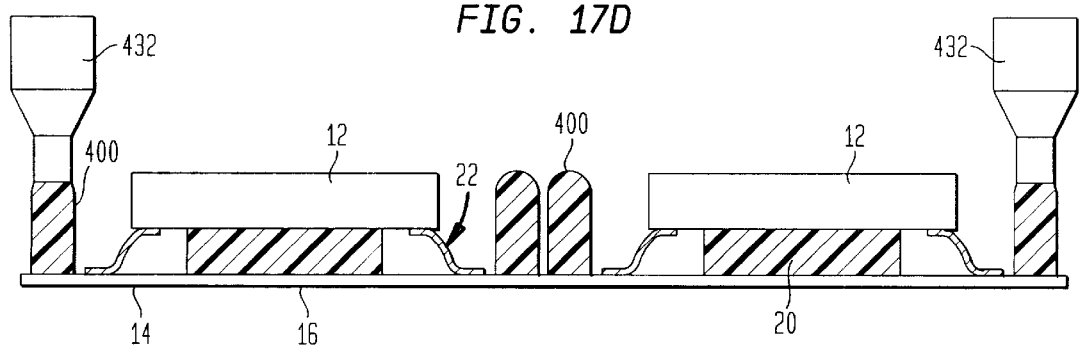
Figure 17E:
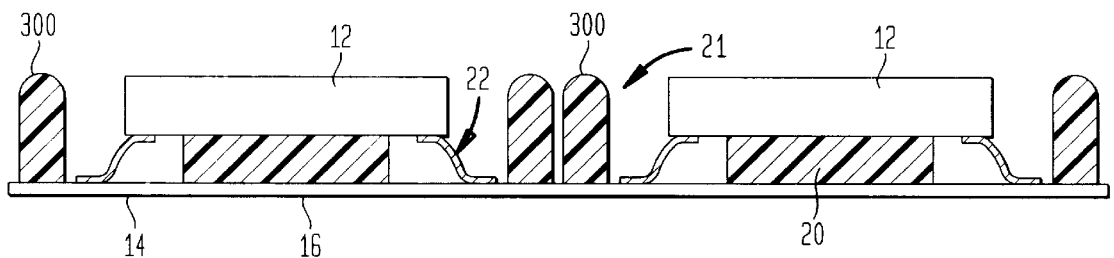
Figure 17F:
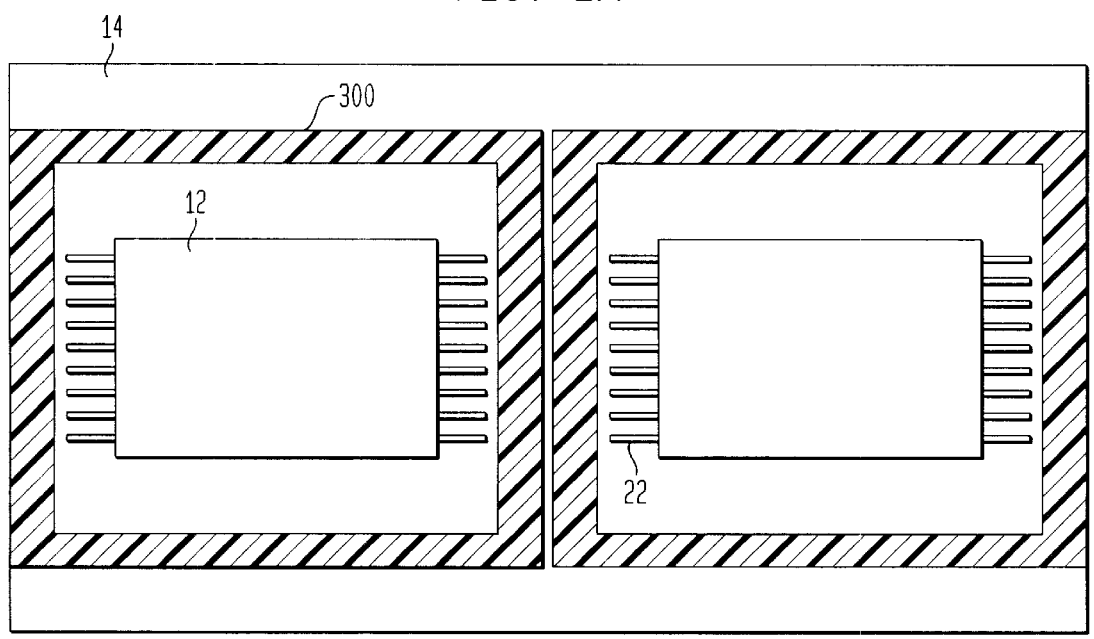
FIG. 17F is a top plan view of the assembly depicted in FIG. 17D.
Figure 17G:
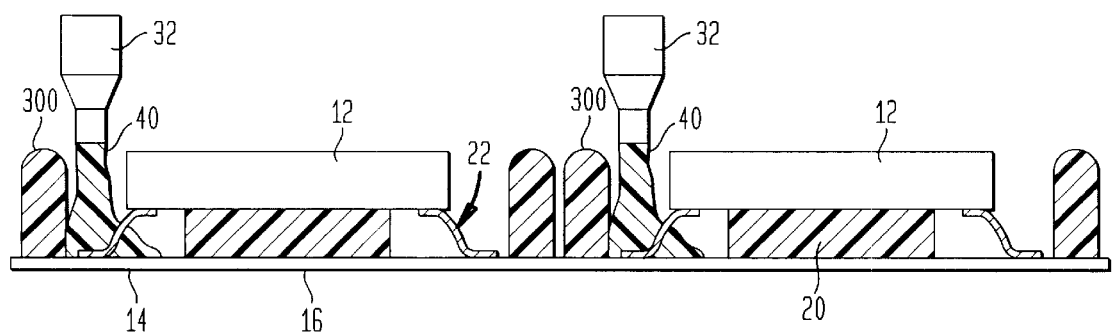
Figure 17H:
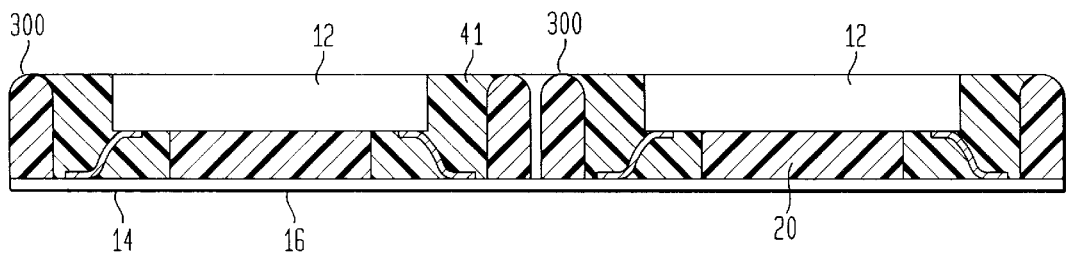
Figure 17I:
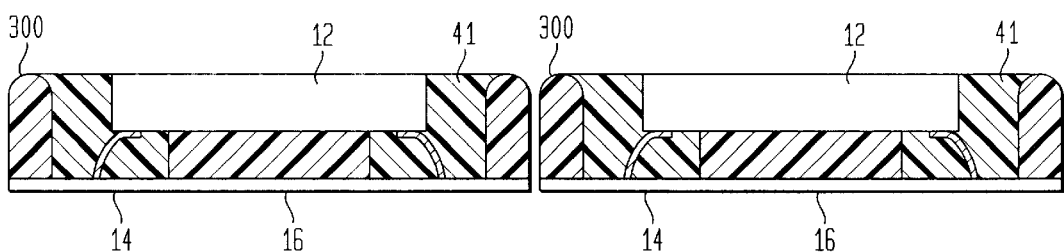
Figure 17J:
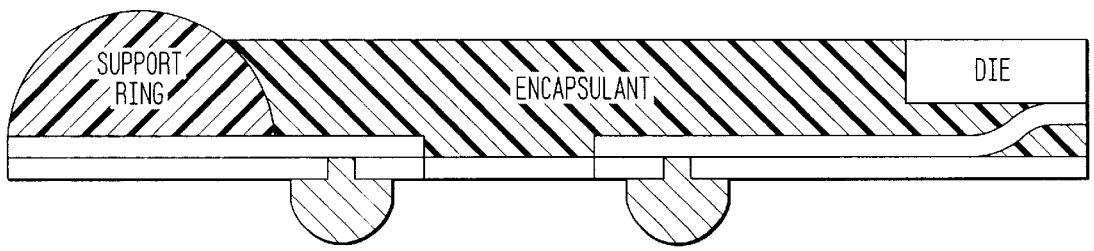
FIG. 17J is an exploded cross-sectional view of a portion semiconductor chip packaged according to the method of the present invention.

Another aspect of the present invention is a method of packaging microelectronic elements using support structures, or a ring grid, which are made in situ. FIGS. 17A–17J depict one method of this aspect of the present invention. A first surface of a sheet-like substrate, such as a chip carrier 14 having a dielectric layer 16, is juxtaposed to at least one microelectronic element, such as a wafer or a semiconductor chip 12. In preferred embodiments, the dielectric layer is flexible. In particularly preferred embodiments, the flexible dielectric layer is comprised of polyimide. In FIG. 17A, two semiconductor chips 12 are juxtaposed to the first surface 17 of chip carrier 14. Chip carrier 14 has a plurality of electrically conductive terminals (not shown) disposed on first surface 17 and each chip 12 has a plurality of electrically conductive contacts (not shown) disposed on its face surface 28. In preferred embodiments, and as depicted in FIG. 17B, a spacer layer, such as compliant layer 20, is disposed between each chip 12 and first surface 17. Although the method depicted in FIGS. 17A–17J shows that the compliant layer is added to the assembly after the chip carrier and chips are juxtaposed, the compliant layer may be formed upon, juxtaposed with, or adhered to, the first surface of the chip carrier and/or the face surfaces of the chip before the chip carrier and chips are juxtaposed. As depicted in FIG. 17C, each chip is electrically interconnected to chip carrier 14 by forming leads 22. In preferred embodiments, leads 22 are flexible. Each lead 22 connects a contact on one of the chips to a terminal disposed on the chip carrier. The leads shown in FIG. 17C are in a fan-out arrangement. Other lead arrangements, such as fan-in or fan-in/fan-out, may also be employed. As depicted in FIG. 17D, a ring-like pattern is formed around each chip 12 by disposing a first composition 400 on first surface 17 of chip carrier 14 around the periphery of each chip 12. For clarity of illustration, the portions of the ring-like pattern which are depicted in cross-section in FIG. 17D and other figures herein, have a height to width ratio that is higher than would normally be encountered with compositions which are preferred for use as first composition 400. A more typical dome-shaped cross section is depicted in FIG. 17J. Numerous factors can, however, affect the cross-sectional shape of the ring-like patterns of first composition. Such factors include, for example, the properties of first composition 400 and chip carrier 14, and the dispense and cure mechanisms employed with such patterns.

In preferred embodiments, first composition 400 is selected such that it will not substantially flow under chip 12 nor make contact with leads 22. In more preferred embodiments, first composition 400 is a substantially non-slumping paste. Preferably, first composition 400 is curable to an epoxy-based, acrylic-based, urethane-based or silicone-based polymer. More preferably, first composition is curable to a rigid epoxy-based resin. Methods of effecting the slumping characteristics of such preferred polymers, such as for example, methods of effecting the surface tension properties of such polymers are generally known in the art and include, for example, adding one or more fillers.

In preferred embodiments and as depicted in FIG. 17D, first composition 400 is dispensed onto the first surface of substrate 14 using a dispense needle 432. As first composition 400 is dispensed from needle 432, chip carrier 14 and/or needle 432 may be moved so that a ring-like pattern of first composition 400 is formed around each chip. A single dispense need 432 may be used to form the ring-like pattern around each chip or, as depicted in FIG. 17D, a plurality of such needles 432 may be used to, for example, decrease the time it takes to make such patterns. Each of the ring-like patterns of first composition 400 is cured to form a support structure 300 disposed around one of the chips 12. In preferred embodiments, a gap 21 is maintained between the periphery of each chip and the associated support structure, as illustrated in FIG. 17E and FIG. 17F which is a top plan view of the assembly of FIG. 17E. As depicted in FIGS. 17G, an encapsulation material, also referred to as second composition 40, is disposed in each of the gaps to encapsulate leads 22 and at least one surface of each chip 12 and to thereby form an interconnected plurality of packaged semiconductor chips. Various methods, such as for example, those disclosed in commonly assigned U.S. patent applications Ser. Nos. 08/975,590, filed Nov. 20, 1997, and 09/067,410, filed Mar. 30, 1999 and in commonly assigned U.S. Pat. No. 5,834,339, the disclosures of which are incorporated herein by reference, may be used to dispense the second composition. Second composition 40 is preferably curable to a dielectric polymer. Preferred dielectric polymers include silicone-based elastomers and gels, silicone-based resins, epoxy-based resins and flexiblized epoxies. Particularly preferred dielectric polymers include those that cure to form silicone-based elastomers and flexiblized epoxies. In preferred embodiments and as depicted in FIG. 17H, second composition 40 is cured to form a cured encapsulant 41. As depicted in FIG. 17I, the interconnected plurality of packaged chips may be diced to form a plurality of individual packaged chips. Although only two chips are pictured in FIGS. 17A–17I and many of the other figures herein, the methods of the present invention are preferably practiced by simultaneously packaging more than two chips on a single chip carrier. The optimum number of chips that can be simultaneously packaged on a single chip carrier will be determined by the respective sizes of the chip carrier and chips. After the chips are encapsulated, they may be diced to form individual chip packages or one or more multichip packages. In preferred embodiments, a plurality of solder balls are disposed on the second surface of the chip carrier before the plurality of interconnected chips are singulated. Each solder ball is electrically connected to one of the terminals. After the packages are singulated, each package may be interconnected to an external circuit by reflowing the solder balls. Other interconnections means known in the art, other than solder balls, may also be employed.

Figure 18A:
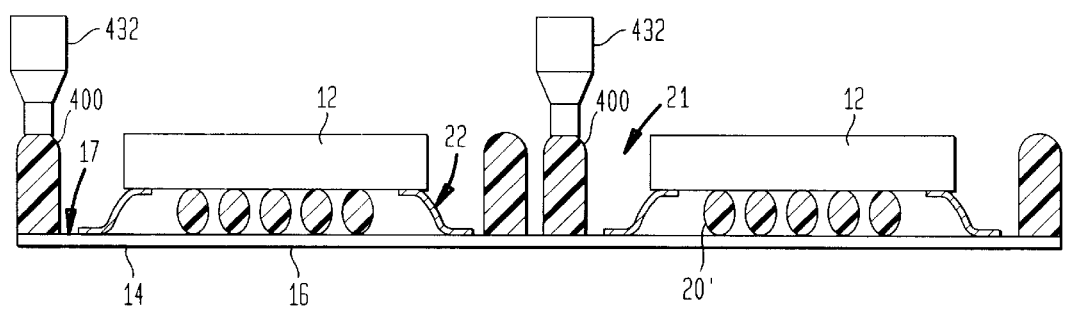
FIGS. 18A–18B show progressive steps in a method according to another embodiment of the present invention of packaging a semiconductor chip using support structures made in situ.
Figure 18B:
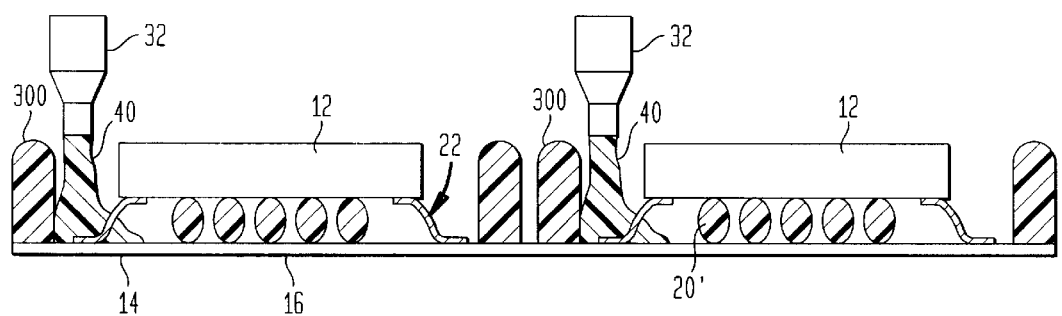

In another embodiment of the present invention, the spacer layer may be comprised of a plurality of compliant pads. As depicted in FIG. 18A, a plurality of compliant pads 20' may be disposed between the first surface of chip carrier 14 and chip 12. In preferred embodiments, the compliant pads are arranged in an area array and are comprised of a thermoset material such as a silicone elastomer or a flexiblized epoxy. Such compliant pads may also be disposed under or within the support structure. Chips 12 are packaged by dispensing first composition 400 onto the first surface 17 of chip carrier 14 around the periphery of each chip 12. First composition 400 is then cured to form support structures 300 and the assembly is encapsulated with second composition 40, as described in the last embodiment and as depicted in FIG. 18B. Each structure 400 is disposed around one of the chips such that there is a gap 21 between the periphery of each chip 12 and associated support structure 300. Second composition 40 is dispensed into the gaps. In preferred embodiments, second composition 40 is then cured and the assembly is diced into individual packaged chips or one or more multichip modules.

Figure 19A:
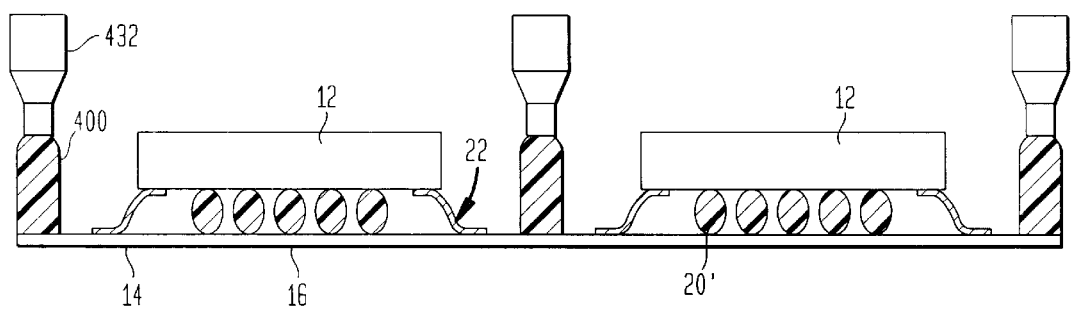
FIGS. 19A and 19C–19E show progressive steps in a method according to another embodiment of the present invention of packaging a semiconductor chip using a ring grid made in situ.
Figure 19B:
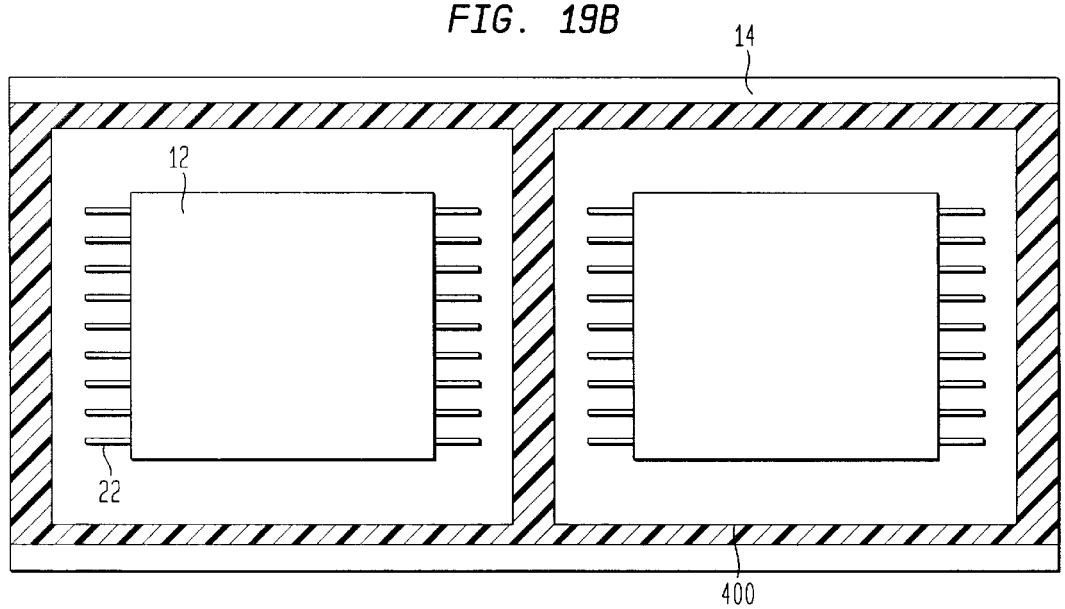
FIG. 19B is a top plan view of the assembly depicted in FIG. 19A.
Figure 19C:
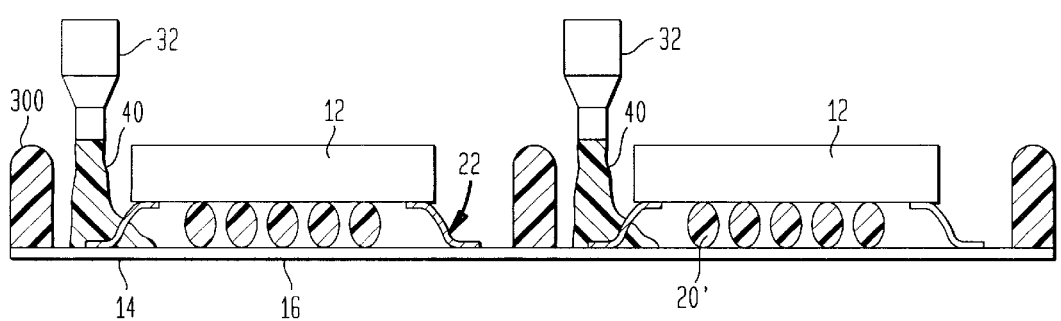
Figure 19D:
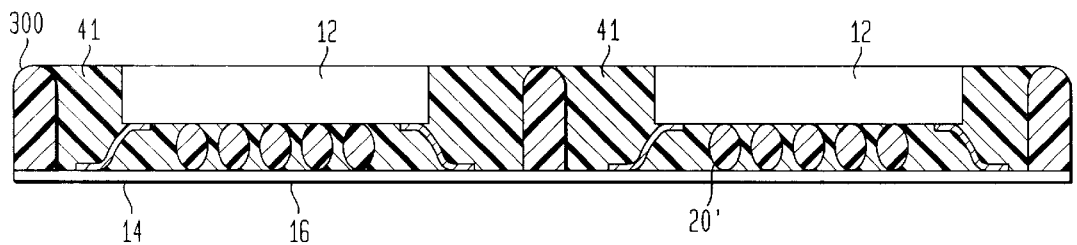
Figure 19E:
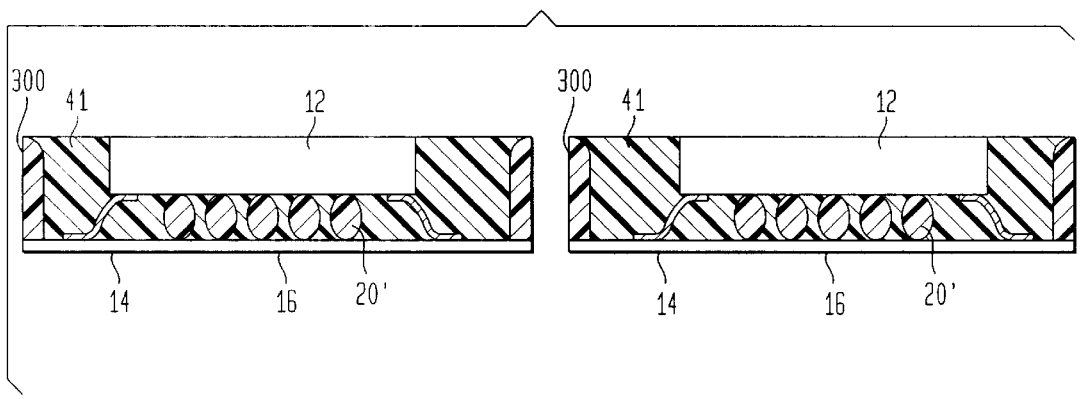

In another embodiment of the present invention, a plurality of chips are packaged using a ring grid. In the method of this embodiment, the support structures are interconnected and form a ring grid. As depicted in FIG. 19A, first composition 400 is dispensed onto the chip carrier 14 in an interconnected ring-like pattern. FIG. 19B is a top plan view of the assembly of FIG. 19A after the interconnected ring-like pattern of first composition 400 has been cured to form an interconnected support structure 300, which is also referred to as ring grid 300. The resulting assembly is then encapsulated as depicted in FIGS. 19C and 19D to form a plurality of interconnected packaged semiconductor chips. In preferred embodiments, the interconnected packaged chips are diced into individual packaged chips, as depicted in FIG. 19E, or diced into multichip packages. The ring grid is also cut during this dicing process such that only a portion of ring grid 300 remains with each packaged chip. In preferred embodiments, the ring grid is formed and diced such that the portion of the ring grid that remains on each side of the package is symmetrical, as depicted in FIG. 19E.

Figure 20A:
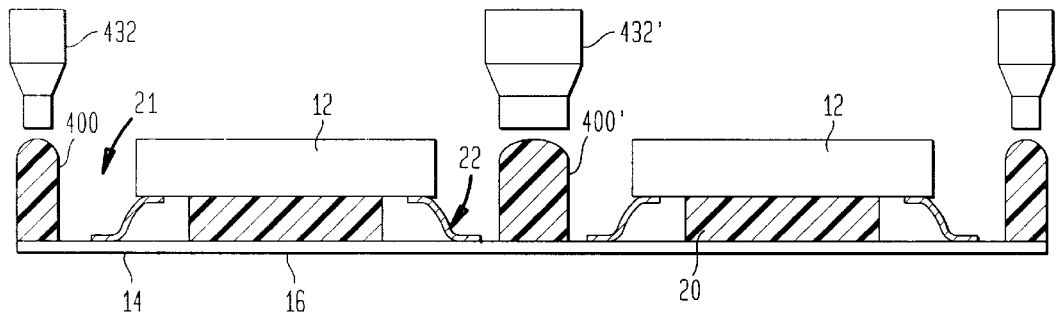
FIGS. 20A–20D show progressive steps in a method according to another embodiment of the present invention of packaging a semiconductor chip using a ring grid made in situ.
Figure 20B:
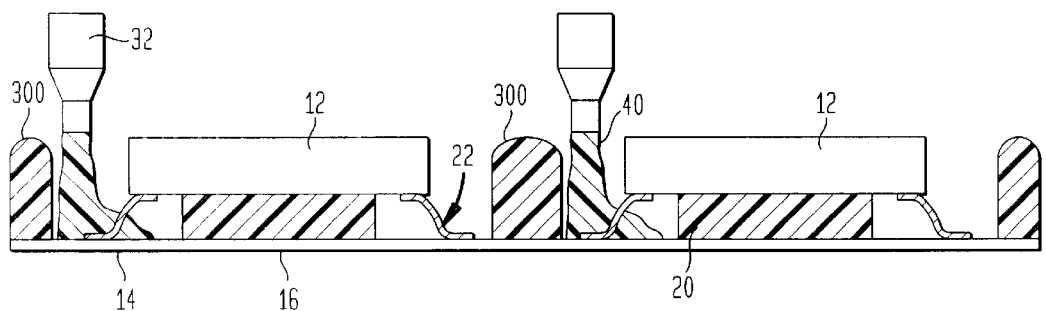
Figure 20C:
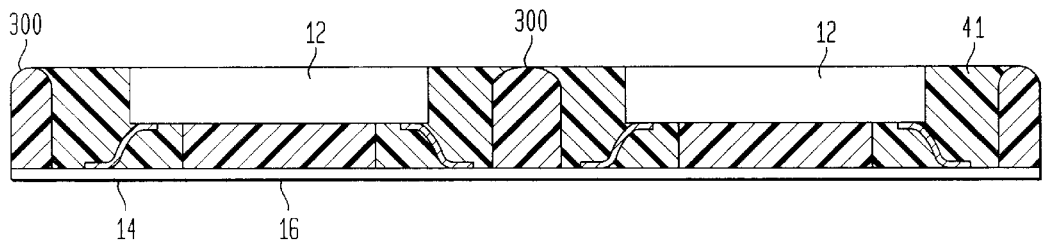
Figure 20D:
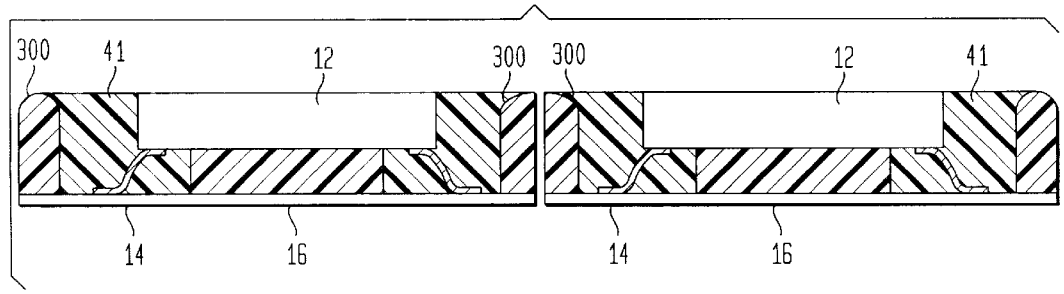

Packaged chips having such symmetrical or substantially symmetrical ring portions may be made in other ways. As depicted in FIG. 20A, a relatively thick section 400' of the ring-like pattern Is formed between adjacent chips 12. Thick section 400' may be formed, for example, by using a larger dispense needle for the sections of the ring-like pattern which lie between chips, by reducing the speed at which the dispense needle travels in relation the chip carrier when such sections are dispensed, or by using two or more passes of the dispense needle to form such sections. After the ring-like pattern is cured, the resulting ring grid 300 has a thick section 300' disposed between the chips, as depicted in FIG. 20B. The assembly may then be encapsulated, as depicted in FIGS. 20B & 20C, to form a plurality of interconnected semiconductor chip packages. As depicted in FIG. 20D, the interconnected plurality of semiconductor chip packages may be singulated. During the singulation process, thick section 300' of ring grid 300 should be cut so that the ring portions remaining in the resulting packages are substantially symmetrically.

Figure 21A:
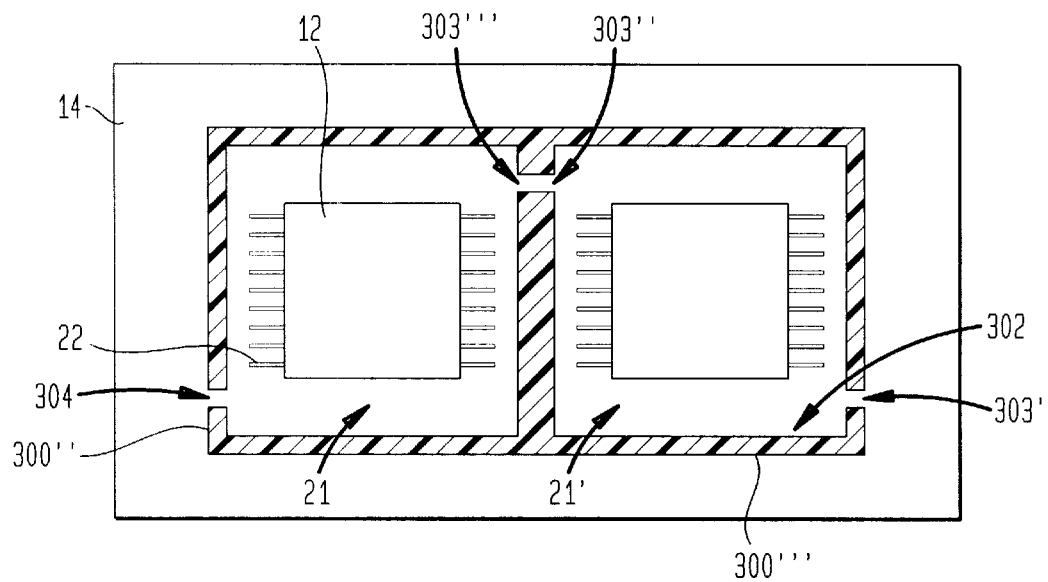
FIGS. 21A–21D show progressive steps in a method according to another embodiment of the present invention of packaging a semiconductor chip using a ring grid made in situ.

In another embodiment of the present invention, each chip is encapsulated by forcing first composition into each gap through one or more openings in the sidewall of the support structure (or ring grid) of the present invention. One or more dispense needles may be used to simultaneously encapsulate a plurality of chips by forcing first composition through such openings and into the gaps between the chips and the support structures, using for example, the method disclosed in the aforementioned '410 patent application. As depicted in FIG. 21A, an assembly is provided which includes a plurality of chips 12, a chip carrier 14, fan-out leads 22 connecting contacts on each chip 12 to terminals disposed on the chip carrier, a support structure 300 surrounding each chip, and a spacer layer (now shown) disposed between the chip carrier and each chip.

Figure 21B:
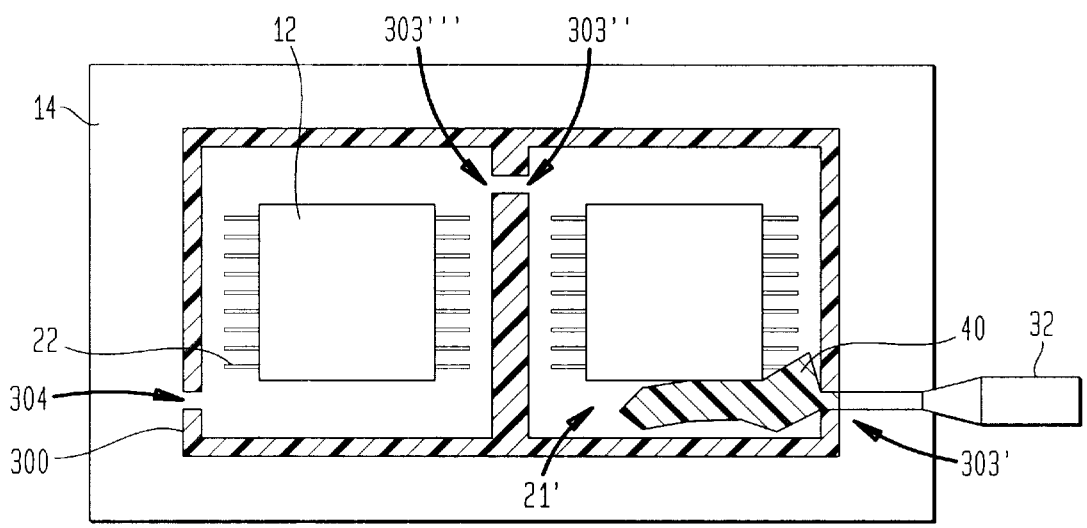
Figure 21C:
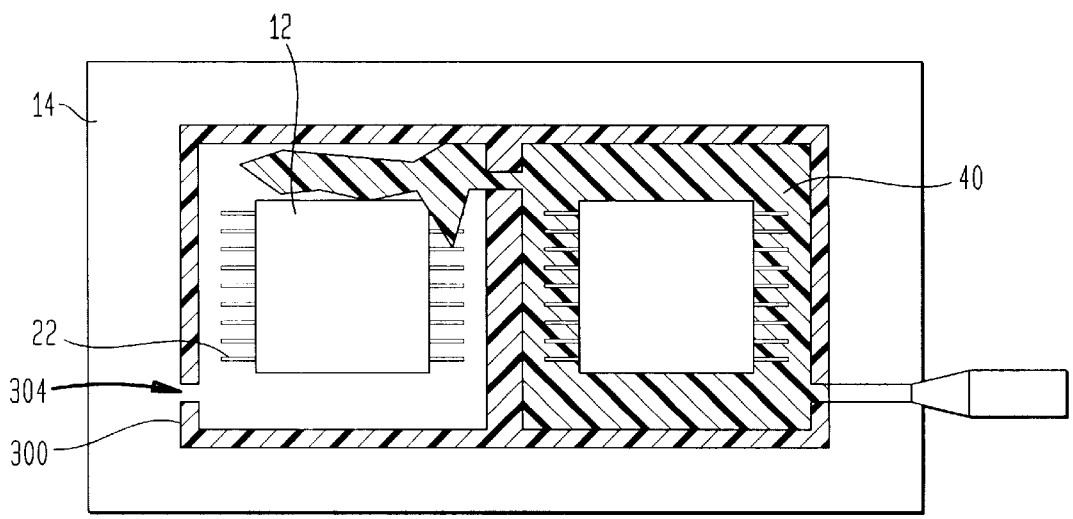
Figure 21D:
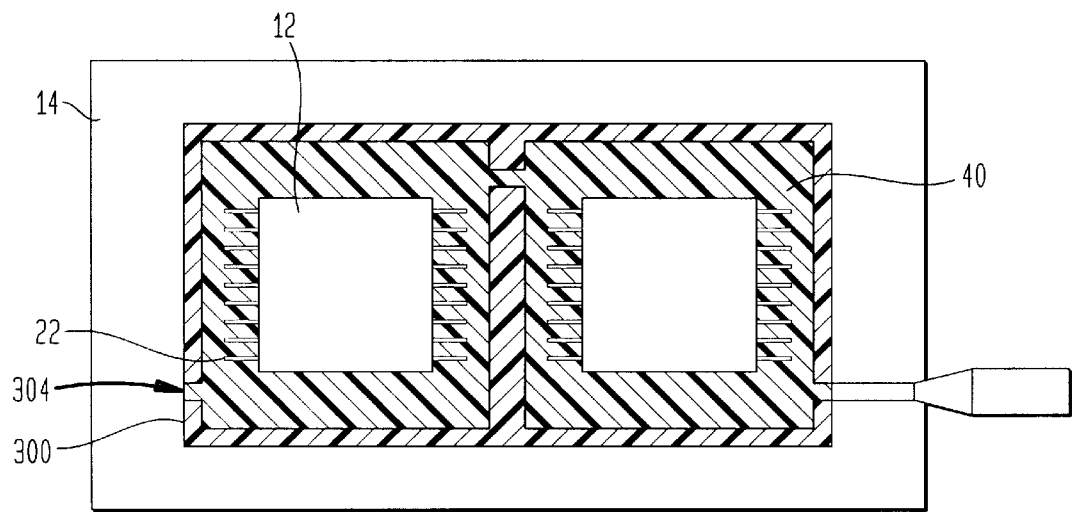

Support structures 300" and 300''' are interconnected to form a ring grid. Each support structure is spaced apart from the associated chip 12 such that there is a gap 21 between the periphery of each chip and the associated support structure. Each support structure has a sidewall 302 and each sidewall has at least one opening 303. Ring grid 300, comprised of interconnected support structures 300" and 300''', may be made by dispensing first composition 400 around the periphery of each chip in an segmented ring like pattern as depicted in FIG. 21A. Methods of dispensing liquid compositions to form segmented ring-like patterns are known in the art. One such method includes dispensing first composition 400 through a dispense needle 432 while moving such needle over the chip carrier in the pattern to be formed. Openings in the pattern may be created by stopping the flow of first composition through the dispense needle while the needle is moved over the portion of the chip carrier where the openings are to be located. In preferred embodiments, first composition 400 is dispensed around, but space apart from, the periphery of each chip. As depicted in FIG. 21B, the patterns of first composition are cured to form ring grid 300. Second composition 40 is dispensed into gap 21' through opening 303'. As depicted in FIG. 21C, additional second composition 40 is dispensed through opening 303' until the second composition 40 flows through opening 303" and aligned opening 303'''. Ring grid 300 may also have an outlet port 304. The dispensing step is continued until each chip has been encapsulated resulting in a plurality of interconnected packaged semiconductor chips, as depicted in FIG. 21D. In preferred embodiments, second composition 40 is cured to an encapsulant 41 and the plurality of interconnected packaged chips are diced.

Figure 22A:
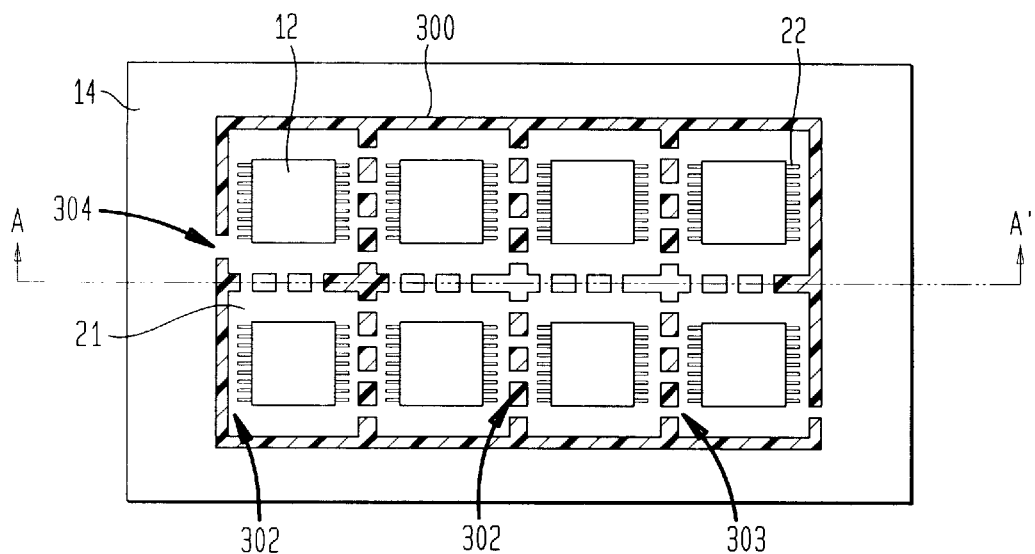
Figure 22B:
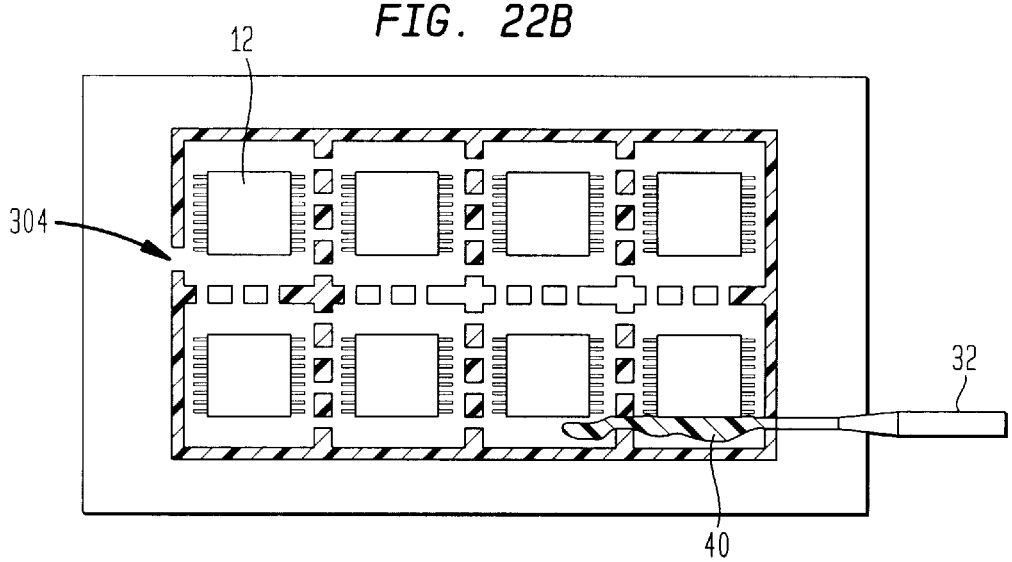
Figure 22C:
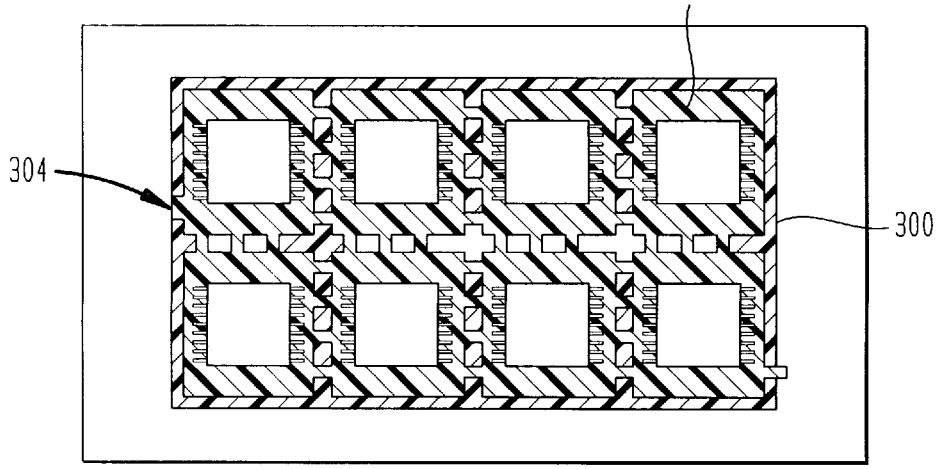

In preferred embodiments and as depicted in FIG. 22A–22C, the openings 303 in the sidewalls 302 of adjacent support structures are aligned to facilitated the simultaneous encapsulation of multiple chips. In preferred embodiments, a coverlay (not shown) is disposed over ring grid 300 before the encapsulation step. Ring grid 300 typically includes an outlet port 304 to allow any air or other gas around the chips. A vacuum pump may be connected to outlet port 304 to facilitate the encapsulation process. In particularly preferred embodiments, the chips are encapsulated by injecting second composition 40, through a plurality of dispense needles and under elevated pressure, into the gaps.

Figure 22D:
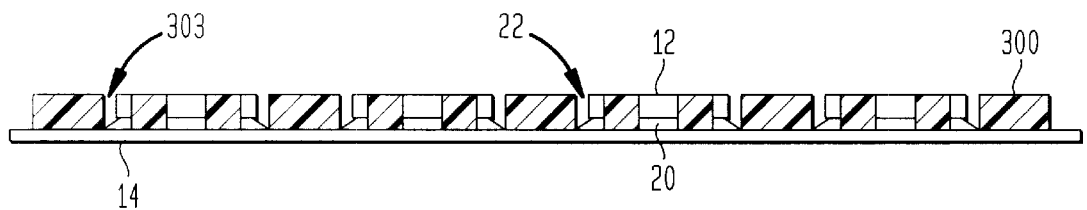
FIG. 22D is a side view of the assembly depicted in FIG. 27A.
Figure 22E:
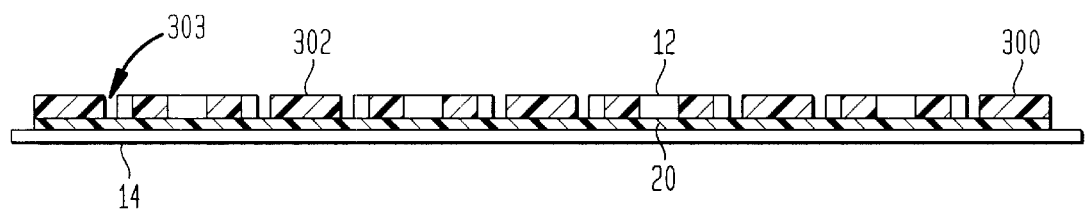
FIG. 22E is a side view of another embodiment of a ring grid made in situ.
Figure 22F:
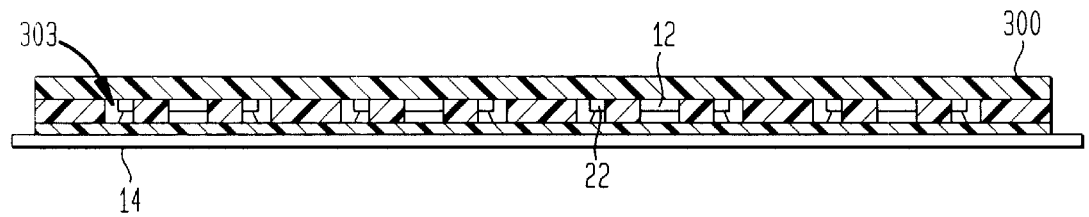
FIG. 22F is a side view of another embodiment of a ring grid made in situ.
Figure 22G:
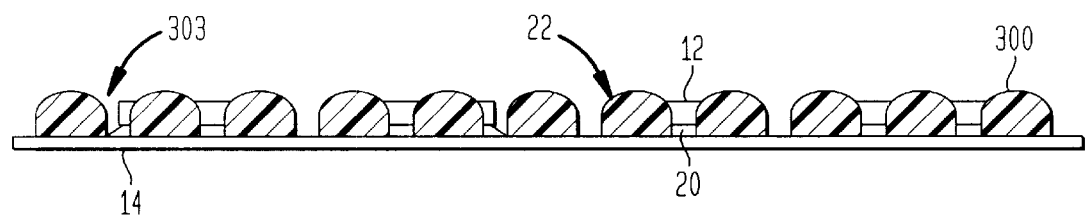
FIG. 22G is a side view of another embodiment of a ring grid made in situ.
Figure 22H:
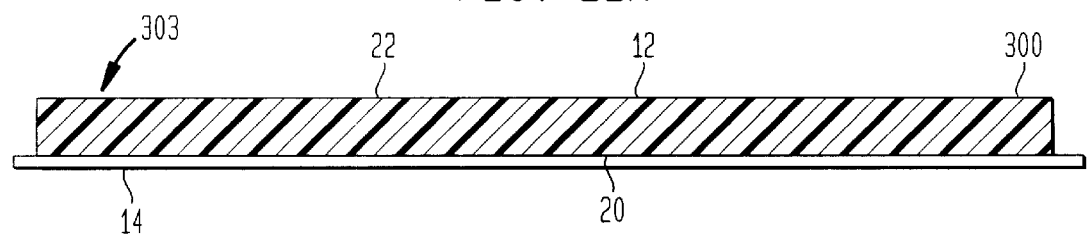
FIG. 22H is a side view of another embodiment of a ring grid made in situ.

The ring-like patterns of first composition may be formed having sections which have different thickness, heights or other dimensions. FIG. 22D is a cross-sectional view of the assembly of FIG. 22A as viewed along line AA'. Examples of other ring grids are depicted in FIGS. 22E–22H. The top surface of ring grid 300 may be co-planar with the back surfaces of the chips (especially when the chips are oriented such that the back surfaces face away from the first surface of the chip carrier) or alternatively may be at a different level than the back surfaces of the chips. In order to facilitate the flow of second composition over the top surface of ring-grid 300 when a coverlay is disposed over the back surfaces of the chips, the ring-like patterns of the first composition may be dispensed and cured such that all or a portion of the top surface of ring grid 300 is at a level which is below the level of the back surfaces of the chips. The sidewalls 302 of ring grid 300 may, for example, be castellated as depicted in FIG. 22E. Alternatively, the openings 303 in ring grid 300 maybe be apertures and the top surface of ring grid 300 may be coplanar with the back surfaces of the chips, as depicted in FIG. 22F, or may at a higher or lower level than such back surface. In another embodiment, a ring grid 300 having a plurality of openings 303 may be formed by dispensing and then curing a plurality of closely spaces dots of first composition, as depicted in FIG. 22G. An unsegmented ring grid 300 is depicted in FIG. 22H.

Figure 23A:
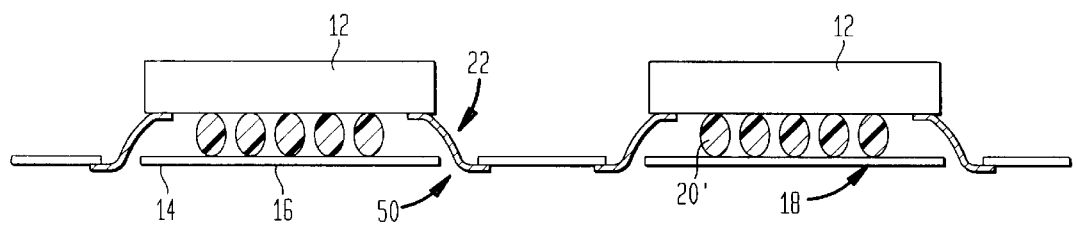
FIGS. 23A–23D show progressive steps in a method according to another embodiment of the present invention of packaging a semiconductor chip using a ring grid made in situ.
Figure 23B:
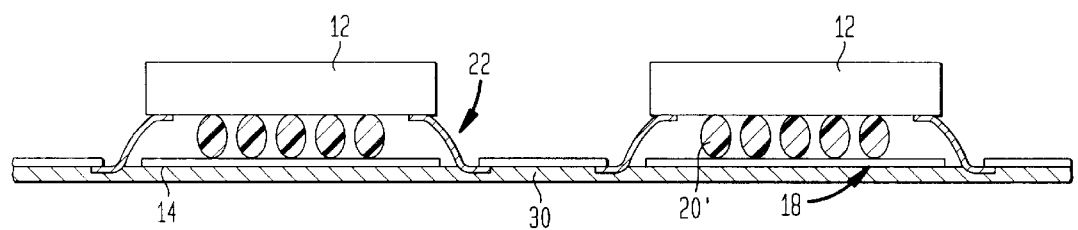

In another embodiment of the present invention, the terminals are disposed on the second surface 18 of chip carrier 14, in a so-called "circuits out" embodiment. As depicted in FIG. 23A, chip carrier 14 has a plurality of bond windows or bonding apertures 50. Bond windows 50 are located to facilitate the bonding of terminals on the bottom surface of the chip carrier to the contacts on the chip using flexible leads 22. To prevent second composition 40 from leaking out of the bond windows, in preferred embodiments such windows are sealed before second composition 40 is dispensed into gaps 21, usually with a bottom coverlay 30, as depicted in FIG. 23B. A coverlay may also be employed to seal the bond windows or other apertures in the substrate in so-called "circuit-in" embodiments, such as, for example, the embodiment pictured in FIG. 17A.

Figure 23C:
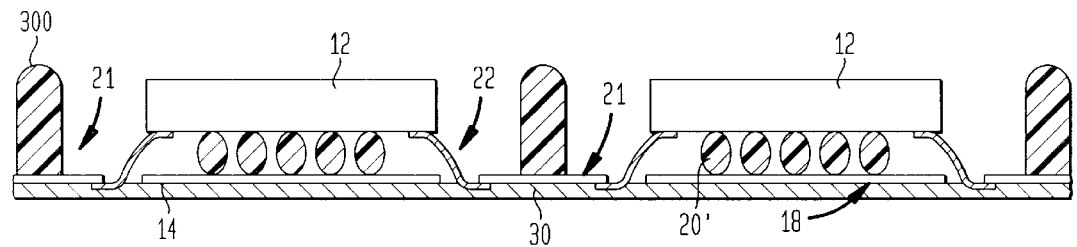
Figure 23D:
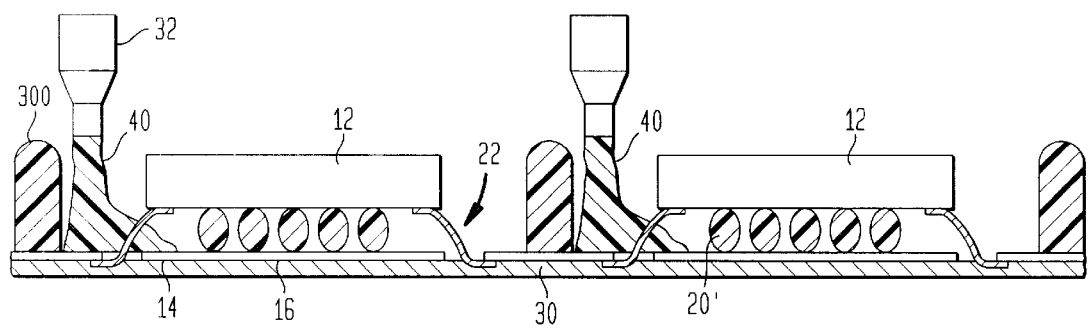
Figure 24:
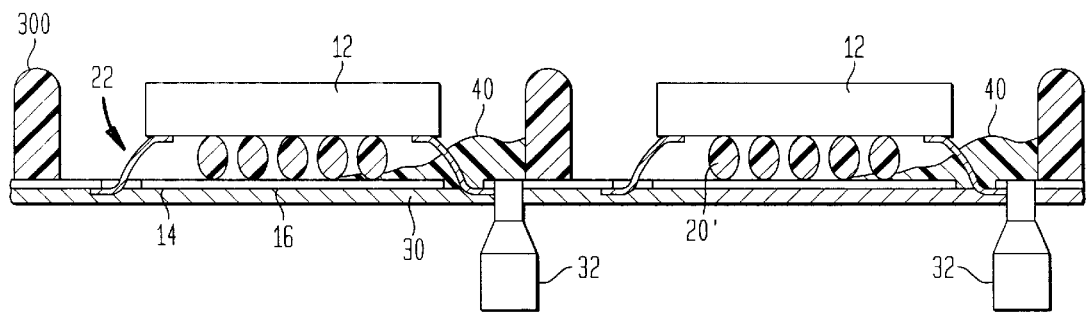
FIG. 24 shows an alternative method of encapsulating the assembly depicted in FIG. 23A.

As depicted in FIG. 23B, the bottom coverlay is typically adhered to bottom surface 18 of chip carrier 14 after leads 22 have been formed. A ring grid 300 is then formed around the periphery of the chips by dispensing and then curing a first composition, as depicted in FIG. 23C. The assembly is then encapsulated using a second composition 40, as depicted in FIG. 23D. Encapsulation processes in which the encapsulant composition is dispensed into directly into gaps 21 as depicted, for example in FIGS. 17G and 23D are sometimes referred to as "backside encapsulation". Although encapsulation may be completed while the assembly is in an "upright position" as depicted in FIG. 23B or an inverted position, backside encapsulation is usually accomplished while the assembly is an upright position. In an alternative encapsulation method, generally referred to as "topside encapsulation", the assembly may be encapsulated by dispensing second composition into the gaps through one or more of the bond windows or another aperture in chip carrier 14, as depicted in FIG. 24. Both top and bottom side encapsulation processes may also be used with assemblies in which the terminals are disposed of the first surface 17 of chip carrier 14.

Figure 25A:
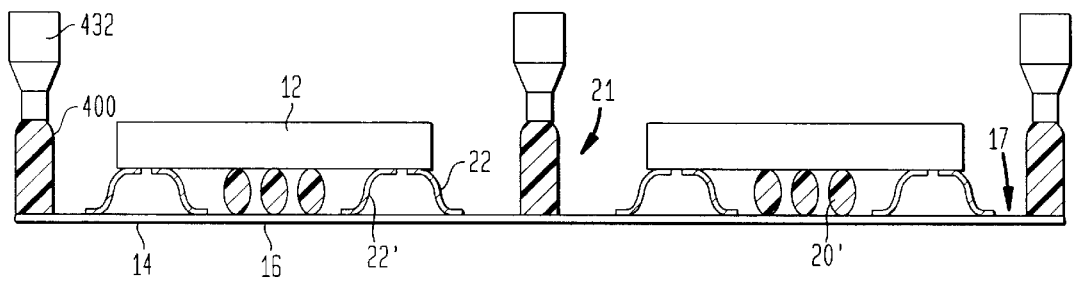
FIGS. 25A–25D show progressive steps in a method according to another embodiment of the present invention of packaging a semiconductor chip using a ring grid made in situ.
Figure 25B:
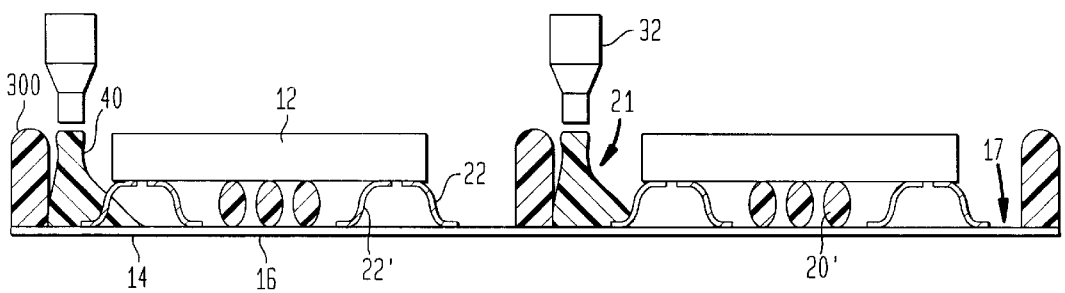
Figure 25C:
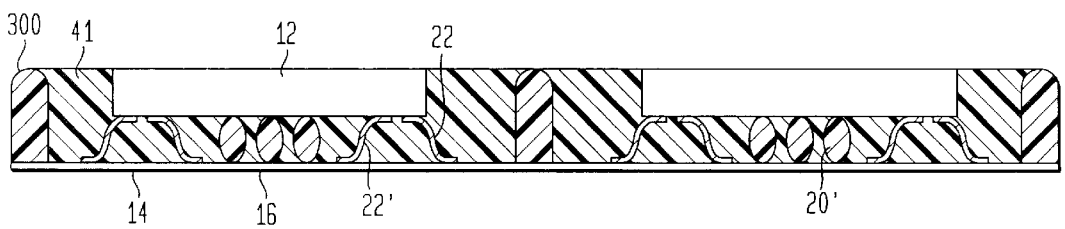
Figure 25D:
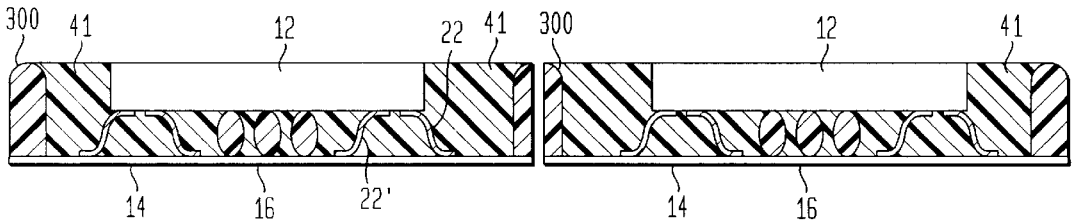

In yet another embodiment of the present invention, some of the contacts on the chip are connected to terminals on the chip carrier using fan-in leads 22'. Using both fan-in and fan-out leads in a single packaged may be desirable when the chip has a large number of contacts. As depicted in FIG. 25A, each chip 12 is connected to chip carrier 14 using both fan-in leads 22' and fan-out leads 22. First composition 400 is dispensed onto the first surface 17 of chip carrier 14 such that there is an interconnected ring-like pattern around the periphery of each chip. The interconnected ring-like pattern is cured to form ring grid 300, and second composition 40 is dispensed into gaps 21, as depicted in FIG. 25B. Second composition 40 is then cured to form cured encapsulant 41 and to thereby form an interconnected plurality of encapsulated chips, as depicted in FIG. 25C. The interconnected chips may then be diced into individual packaged chips as depicted in FIG. 25D.

Figure 26A:
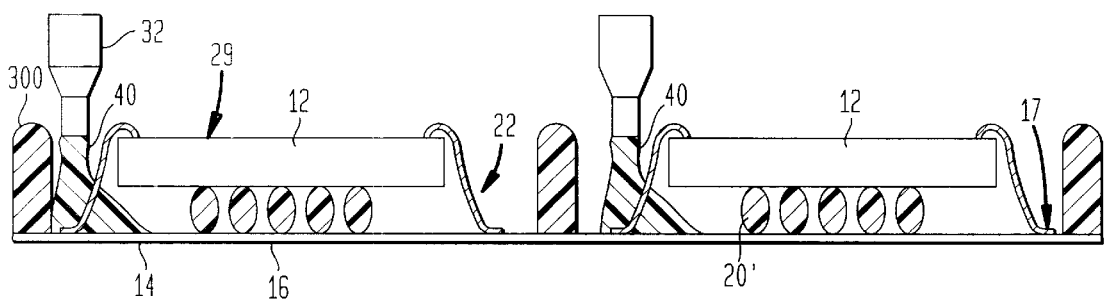
FIG. 26A–26B show progressive steps in a method according to another embodiment of the present invention of packaging a semiconductor chip using a ring grid made in situ.
Figure 26B:
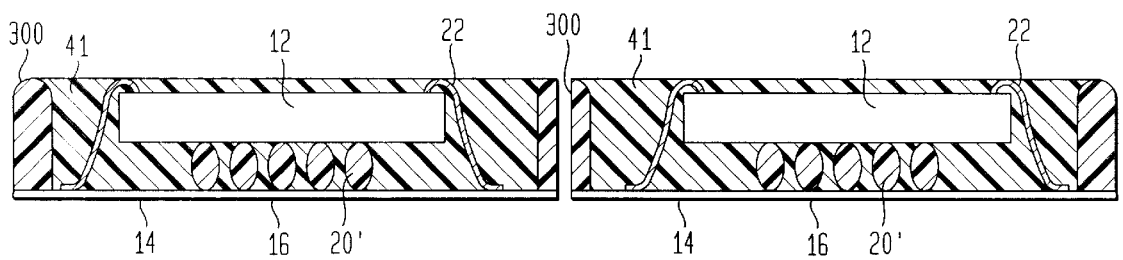

In yet another embodiment of the present invention the chip is inverted such that the contact bearing face surface of the chip faces away from the chip carrier, in a so-called "face-up" embodiments. As depicted in FIG. 26A, the back surfaces 29 of chips 12 face the first surface of chip carrier 14. In preferred embodiments, such back surfaces are adhered to first surface 17 of chip carrier 14 using a die attach adhesives such as those described above. Leads 22 connect contacts disposed on the face surfaces 28 of chip 12 to terminals disposed on first surface 17 of chip carrier 14. In preferred embodiments, second composition 40 is selected and dispensed to insure that leads 22 are fully encapsulated, as depicted in FIG. 26B.

In an alternative embodiment, the chip may have some contacts disposed its face surface 29, some contacts disposed its back surface 28, and the package may have some leads connecting such face surface contacts to terminals disposed on the chip carrier and some leads connecting such back surface contacts to terminals disposed on the chip carrier.

Figure 27A:
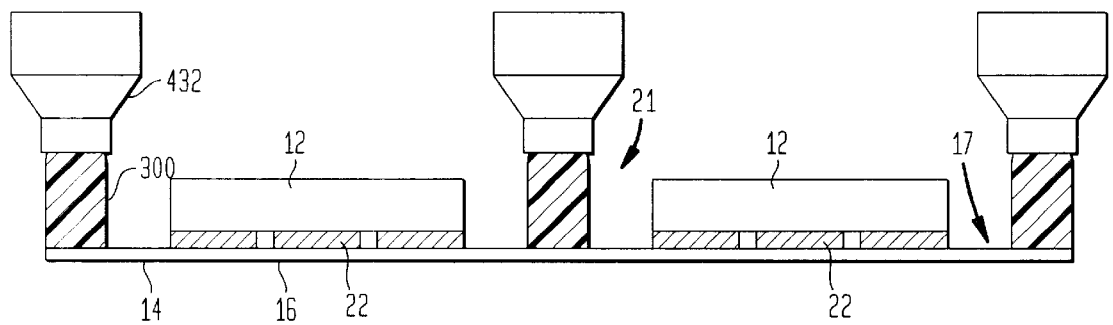
FIGS. 27A–27E show progressive steps in a method according to another embodiment of the present invention of packaging a semiconductor chip using a ring grid made in situ.
Figure 27B:
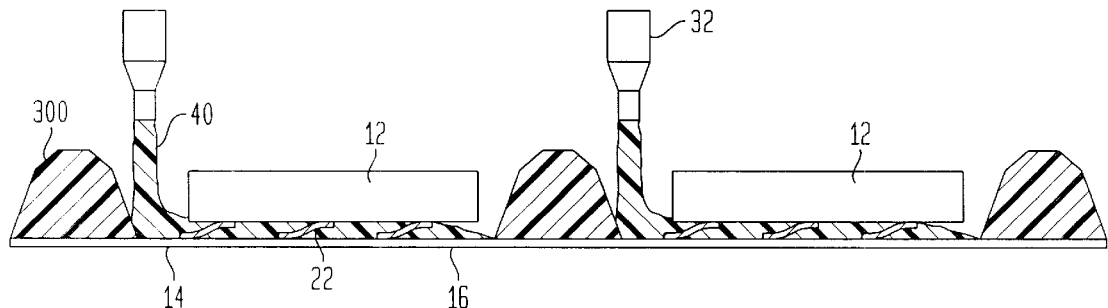
Figure 27C:
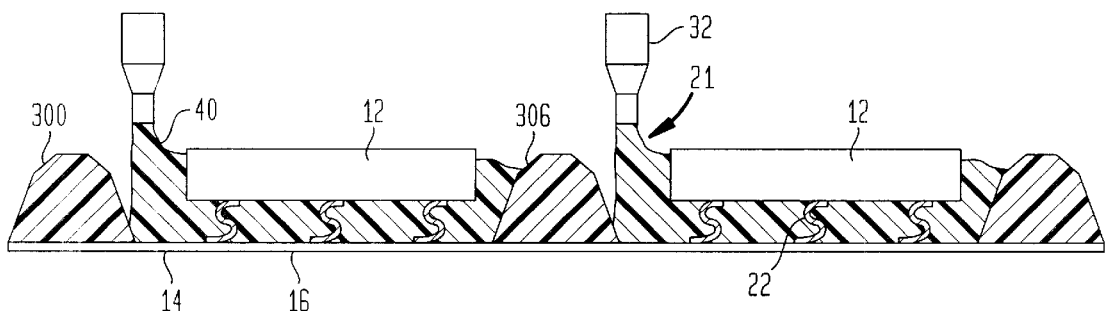
Figure 27D:
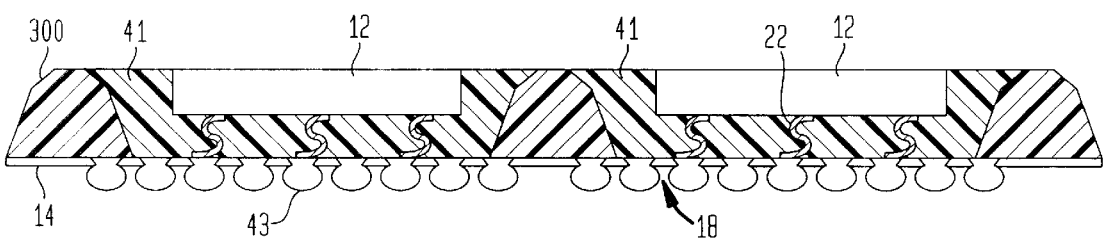
Figure 27E:
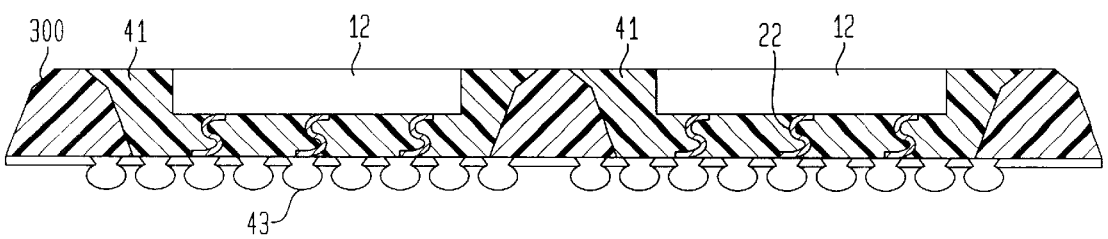

In yet another embodiment of the present invention, the leads are formed into "S" shaped flexible leads during the encapsulation process, using, for example, the methods disclosed in commonly assigned U.S. Pat. No. 5,518,964, the disclosure of which is incorporated herein by reference. In the method of this embodiment of the present invention, and as depicted in FIG. 27A, a chip carrier 14 and a plurality of chips 12, which are interconnected with planar leads 22. A ring grid 300 is formed on the first surface 17 of the chip carrier 14 by dispensing and then curing a first composition 400 in a ring like pattern around the chips. A second composition 40 is then dispensed into gaps 21, as depicted in FIG. 27B. A coverlay (not shown) is typically employed over the top surface 306 of ring grid 300 to contain second composition 40 as it is dispensed and flows between chips 12 and chip carrier 14, causing the chips and the chip carrier to separate from one another and causing leads 22 to become vertically extended. As depicted in FIG. 27C and as further described in the aforementioned '964 patent, leads 22 may be formed into flexible "S"-shaped by horizontally moving chips 12 with respected to chip carrier 14. In preferred embodiments and as depicted in FIG. 27D, a plurality of solder balls 43 are disposed on the second surface 18 of the substrate 14. Each solder ball is electrically interconnected to the terminals exposed at the second surface of the substrate. The solder balls may be used to interconnect the package to an external circuit such as a printed circuit board. Other board level interconnections means know in the art may also be employed. In preferred embodiments and prior to connection to a printed circuit board, the interconnected plurality of packaged microelectronic elements are singulated into individual packaged microelectronic elements, as depicted in FIG. 27E.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A method of packaging a semiconductor chip, comprising:
   A. providing a sub-assembly comprising:
      a sheet-like substrate having a first surface, a second surface opposite the first surface, and a plurality of terminals exposed on the second surface; and
      a semiconductor chip having a face surface facing the first surface of the substrate and a plurality of contacts disposed on the face surface;
   B. electrically connecting each of the contacts to one of the terminals;
   C. depositing a first composition in a ring-like pattern on the first surface of the substrate around the periphery of the semiconductor chip;
   D. curing the first composition; and
   E. depositing a second composition to wet at least a portion of the sub-assembly and at least a portion of the first composition.

2. A method of packaging a plurality semiconductor chips, comprising:
   A. providing a sub-assembly comprising:
      a sheet-like substrate having a first surface, a second surface opposite the first surface, and a plurality of terminals exposed on the second surface; and
      a plurality of semiconductor chips, each of the semiconductor chips having a face surface facing the first surface of the substrate and a plurality of contacts disposed on the face surface;
   B. electrically connecting each of the contacts to one of the terminals;
   C. depositing a first composition in a ring-like pattern on the first surface of the substrate around the periphery of each of the semiconductor chips;
   D. curing the first composition to form a plurality of support structures, wherein each support structure is disposed around the periphery of one of the semiconductor chip; and E. depositing a second composition to wet at least a portion of the sub-assembly and at least a portion of each of the support structures.

3. The method of claim 2, further comprising curing the second composition.

4. The method of claim 3, wherein the electrically connecting step includes forming a plurality of leads, wherein each lead connects one of the contracts to one of the terminals.

5. The method of claim 4, wherein at least some of the leads are fan-out leads.

6. The method of claim 5, wherein at least some of the leads are fan-in leads.

7. The method of claim 5, wherein the leads are flexible.

8. The method of claim 7, wherein the substrate includes a flexible dielectric layer.

9. The method of claim 8, wherein the first composition is curable to a material that is capable of rigidizing the flexible dielectric layer.

10. The method of claim 9, wherein the first composition is substantially non-slumping.

11. The method of claim 10, wherein each support structure is comprised of an epoxy, an acrylic, a urethane or a silicone.

12. The method of claim 10, wherein each support structure is comprised of an epoxy or an acrylic.

13. The method of claim 12, wherein each support structure is comprised of an epoxy.

14. The method of claim 9, wherein the ring-like patterns formed during the step of depositing first composition includes are interconnected such that the plurality of support structures formed by curing the first composition form a ring grid.

15. The method of claim 14, wherein each of the support structures has a sidewall.

16. The method of claim 15, wherein each of the sidewalls has at least two openings, at least of the openings being adapted to facilitate the flow of second composition therethrough.

17. The method of claim 16, further comprising the step of reducing the pressure in the sub-assembly to below atmospheric pressure during the depositing second composition step.

18. The method of claim 17, wherein the ring grid has a top surface facing away from the first surface of the substrate and said method further comprises the step of attaching a coverlay to the top surface of the ring grid and the back surfaces of the semiconductor chips.

19. The method of claim 15, wherein each of the support structures has a domed-shaped cross section.

20. The method of claim 19, wherein the height of the sidewall of any support structure, as measured at the top of the dome-shaped cross section, is uniform across said sidewall.

21. The method of claim 15, wherein the sidewall of each support structure is castellated.

22. The method of claim 15, wherein the sub-assembly further comprises a spacer layer disposed between the face surface of each semiconductor chip and the first surface of the substrate.

23. The method of claim 22, wherein the spacer layer is compliant.

24. The method of claim 15, wherein the second composition is curable to a compliant encapsulant.

25. The method of claim 24, wherein the step of depositing the second composition to wet at least a portion of the sub-assembly and at least a portion of each of the support structures includes 1) depositing second composition between the face surface of each semiconductor chip and the first surface of the substrate to form a spacer layer disposed between said face surface and said first surface; and 2) vertically extending the leads.

26. The method of claim 24, wherein 1) the ring-like pattern associated with each semiconductor chip is spaced apart from the periphery of said semiconductor chips; and 2) upon cure of the first composition, a gap is formed between each support structure and the periphery of the associated semiconductor chip.

* * * * *

UNITED STATES PATENT AND TRADEMARK OFFICE
CERTIFICATE OF CORRECTION

PATENT NO. : 6,214,640 B1
DATED : April 10, 2001
INVENTOR(S) : Fosberry et al.

It is certified that error appears in the above-identified patent and that said Letters Patent is hereby corrected as shown below:

Column 1,
Line 29, "constriction" should read -- construction --
Line 33, ", A" should read -- , a --
Line 44, "component" should read -- components --
Line 55, "structure" should read -- structures --

Column 4,
Line 10, "so called-" should read -- so-called --
Line 24, "is" should read -- are --
Line 24, "view" should read -- views --
Line 42, "portion" should read -- portion of a --

Column 5,
Line 46, "carrier," should read -- carrier --

Column 9,
Line 29, "using," should read -- using --
Line 48, "stand off" should read -- stand-off --
Line 49, "the a semicon-" should read -- the semicon- --

Column 10,
Line 12, "Solderballs" should read -- Solder balls --
Line 19, "overly" should read -- overlie --
Line 37, "connect ed" should read -- connected --

Column 11,
Line 20, "such the" should read -- such as the --
Line 46, "along side" should read -- alongside --

Column 12,
Line 19, "Support" should read -- support --

Column 13,
Line 25, "show n" should read -- shown --
Line 63, "has a" should read -- has an --

Column 14,
Line 4, "have" should read -- has --
Line 56, "desirably is between" should read -- desirably between --

UNITED STATES PATENT AND TRADEMARK OFFICE
CERTIFICATE OF CORRECTION

PATENT NO. : 6,214,640 B1
DATED : April 10, 2001
INVENTOR(S) : Fosberry et al.

It is certified that error appears in the above-identified patent and that said Letters Patent is hereby corrected as shown below:

Column 17,
Line 16, "Is" should read -- is --
Line 20, "relation the" should read -- relation to the --
Line 56, "in an" should read -- in a --
Line 66, "space" should read -- spaced --

Column 18,
Line 13, "FIG." should read -- FIGS. --
Line 15, "facilitated" should read -- facilitate --
Lines 42-43, "maybe be" should read -- may be --
Line 45, "maybe be" should read -- may be --

Column 19,
Line 6, "dispensed into directly" should read -- dispensed directly --
Line 7, "23D" should read -- 23D, --
Line 12, "assembly is an" should read -- assembly is in an --
Line 24, "packaged" should read -- package --
Line 40, "in a so-called" should read -- in so-called --
Line 44, "using a die" should read -- using die --
Line 65, "12, which are" should read -- 12, are --

Column 20,
Line 10, "shaped" should read -- shapes --
Line 11, "respected" should read -- respect --
Line 18, "know" should read -- known --
Line 50, "plurality semiconductor" should read -- plurality of semiconductor --

UNITED STATES PATENT AND TRADEMARK OFFICE
CERTIFICATE OF CORRECTION

PATENT NO. : 6,214,640 B1
DATED : April 10, 2001
INVENTOR(S) : Fosberry et al.

It is certified that error appears in the above-identified patent and that said Letters Patent is hereby corrected as shown below:

<u>Column 21,</u>
Line 2, "chip" should read -- chips --
Line 32, includes are" should read -- are --
Line 37, "at least of" should read -- at least one of --

Signed and Sealed this

Twenty-seventh of November, 2001

*Attest:*

NICHOLAS P. GODICI
*Attesting Officer*      *Acting Director of the United States Patent and Trademark Office*